(12) United States Patent
Kato et al.

(10) Patent No.: US 12,308,865 B2
(45) Date of Patent: May 20, 2025

(54) MULTIPLEXER AND COMMUNICATION DEVICE

(71) Applicant: Murata Manufacturing Co., Ltd., Kyoto (JP)

(72) Inventors: Masanori Kato, Kyoto (JP); Syunsuke Kido, Kyoto (JP); Yukiteru Sugaya, Kyoto (JP); Hiroshi Matsubara, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 426 days.

(21) Appl. No.: 17/811,357

(22) Filed: Jul. 8, 2022

(65) Prior Publication Data

US 2022/0345158 A1 Oct. 27, 2022

Related U.S. Application Data

(63) Continuation of application No. PCT/JP2021/011277, filed on Mar. 18, 2021.

(30) Foreign Application Priority Data

Apr. 2, 2020 (JP) .................................. 2020-066437

(51) Int. Cl.
*H04B 1/00* (2006.01)
*H04B 1/10* (2006.01)

(52) U.S. Cl.
CPC ......... *H04B 1/0057* (2013.01); *H04B 1/1036* (2013.01)

(58) Field of Classification Search
CPC .......... H04J 14/0307; H04J 14/02; H04J 1/08; H04J 14/0282; H04J 1/045; H04J 14/0206;

(Continued)

(56) References Cited

U.S. PATENT DOCUMENTS

2004/0116098 A1* 6/2004 Ochii .................. H03H 9/725
455/333
2013/0142295 A1 6/2013 Badke et al.
(Continued)

FOREIGN PATENT DOCUMENTS

JP 2002-141764 A 5/2002
JP 2013-243600 A 12/2013
(Continued)

OTHER PUBLICATIONS

A compact high selectivity seventh-order UWB bandpass filter with ultra-stopband attenuation', Hammed et al., 2012 (Year: 2012).*

(Continued)

*Primary Examiner* — Khalid W Shaheed
(74) *Attorney, Agent, or Firm* — McDonald Hopkins LLC

(57) ABSTRACT

A multiplexer includes filters and low pass filters. A second frequency band and a third frequency band are partially different. A first frequency band does not overlap the second frequency band and the third frequency band. One end of the filter is connected to a common terminal and the other end is connected to an input/output terminal. The low pass filter is connected in one end to the common terminal and in the other end to one end of the filter. The other end of the filter is connected to one end of the low pass filter. The other end of the low pass filter is connected to the input/output terminal. One end of the filter is connected to a node between the other end of the low pass filter and one end of the filter and the other end of the filter is connected to the input/output terminal.

13 Claims, 17 Drawing Sheets

(58) Field of Classification Search
CPC .. H04J 14/02764; H04J 14/06; H03H 7/0161; H03H 17/0266; H03H 7/463
See application file for complete search history.

(56) References Cited

U.S. PATENT DOCUMENTS

| | | | |
|---|---|---|---|
| 2015/0077194 A1* | 3/2015 | Ebihara | H03H 7/465 |
| | | | 333/132 |
| 2015/0304059 A1* | 10/2015 | Zuo | H04B 1/0057 |
| | | | 370/343 |
| 2016/0197390 A1 | 7/2016 | Nakajima | |
| 2018/0041190 A1 | 2/2018 | Yoshimura et al. | |
| 2018/0227770 A1* | 8/2018 | Zhan | H04B 7/15542 |
| 2019/0044548 A1 | 2/2019 | Freisleben | |
| 2019/0288826 A1* | 9/2019 | Yoshimi | H04L 5/1461 |
| 2020/0280296 A1 | 9/2020 | Mori | |
| 2020/0336132 A1* | 10/2020 | Matsubara | H03H 7/38 |
| 2020/0412336 A1* | 12/2020 | Hanaoka | H03H 9/70 |
| 2021/0006274 A1* | 1/2021 | Kani | H03H 7/46 |
| 2021/0159925 A1* | 5/2021 | Mori | H04B 1/0067 |

FOREIGN PATENT DOCUMENTS

| | | |
|---|---|---|
| JP | 2018-170755 A | 11/2018 |
| JP | 2019-508961 A | 3/2019 |
| WO | 2019/102848 A1 | 5/2019 |

OTHER PUBLICATIONS

International Search Report for PCT/JP2021/011277 dated Jun. 1, 2021.

* cited by examiner

BandA > BandB ≠ BandC

BandA > BandB ≠ BandC

BandA > BandB ≠ BandC

BandA > BandB ≠ BandC

BandA < BandB ≠ BandC

BandA > BandB ≠ BandC

BandA > BandB ≠ BandC

BandA< BandB ≠ BandC

BandA > BandB ≠ BandC > BandD

MULTIPLEXER AND COMMUNICATION DEVICE

CROSS REFERENCE TO RELATED APPLICATION

This is a continuation of International Application No. PCT/JP2021/011277 filed on Mar. 18, 2021 which claims priority from Japanese Patent Application No. 2020-066437 filed on Apr. 2, 2020. The contents of these applications are incorporated herein by reference in their entireties.

BACKGROUND ART

Technical Field

The present disclosure relates to multiplexers and communication devices.

In mobile communication equipment such as cellular phones, the multiplexer arranged directly below the antenna is desired to be small in size and low in loss.

Patent Document 1 discloses a multiplexer having a first circuit configured of a low pass filter (LPF) and a high pass filter (HPF) and a second circuit configured of a band pass filter (BPF) and a band elimination filter (BEF) commonly connected to the HPF.

Patent Document 1: Japanese Unexamined Patent Application Publication No. 2018-170755

BRIEF SUMMARY

In Patent Document 1, the HPF of the first circuit has a function of attenuating the pass band of the LPF. With the HPF, isolation between a signal passing through the HPF and a signal passing through the LPF can be ensured.

Here, since the BEF of the second circuit has a low function of attenuating the pass band of the LPF, the HPF is required for the signal path where the BEF is arranged. On the other hand, the BPF of the second circuit has a high function of attenuating the pass band of the LPF, compared with the BEF. Thus, when the HPF is arranged on the signal path where the BPF is arranged, the function of attenuating the pass band of the LPF is excessive (overspec). Accordingly, since the HPF is arranged on the signal path where the BPF is arranged, transmission loss in that signal path is degraded. That is, a difference in attenuation required for the pass band of the LPF (or HPF) occurs between two filters (the BPF and the BEF in Patent Document 1) commonly connected to the HPF (or LPF), thereby posing a problem of degradation in transmission loss of the signal path where one of the two filters is arranged.

The present disclosure provides a multiplexer and a communication device which achieve low loss and high isolation.

A multiplexer according to an aspect of the present disclosure includes: a common terminal; a first input/output terminal; a second input/output terminal; a third input/output terminal; a first filter taking a first frequency band as a pass band; a second filter taking a second frequency band as a pass band and a third frequency band as an attenuation band; a third filter taking the third frequency band as a pass band and the first frequency band and the second frequency band as attenuation bands; a fourth filter taking the second frequency band and the third frequency band as pass bands and the first frequency band as an attenuation band; and a fifth filter taking the second frequency band and the third frequency band as pass bands and the first frequency band as an attenuation band. The second frequency band and the third frequency band are at least partially different in frequency. The first frequency band does not overlap the second frequency band and the third frequency band in frequency. One end of the first filter is connected to the common terminal and another end of the first filter is connected to the first input/output terminal. One end of the fourth filter is connected to the common terminal and another end of the fourth filter is connected to one end of the second filter. Another end of the second filter is connected to one end of the fifth filter. Another end of the fifth filter is connected to the second input/output terminal. One end of the third filter is connected to a connection node between the other end of the fourth filter and the one end of the second filter and another end of the third filter is connected to the third input/output terminal.

According to the present disclosure, it is possible to provide a multiplexer and a communication device which achieve low loss and high isolation.

DETAILED DESCRIPTION

Figure 1A:
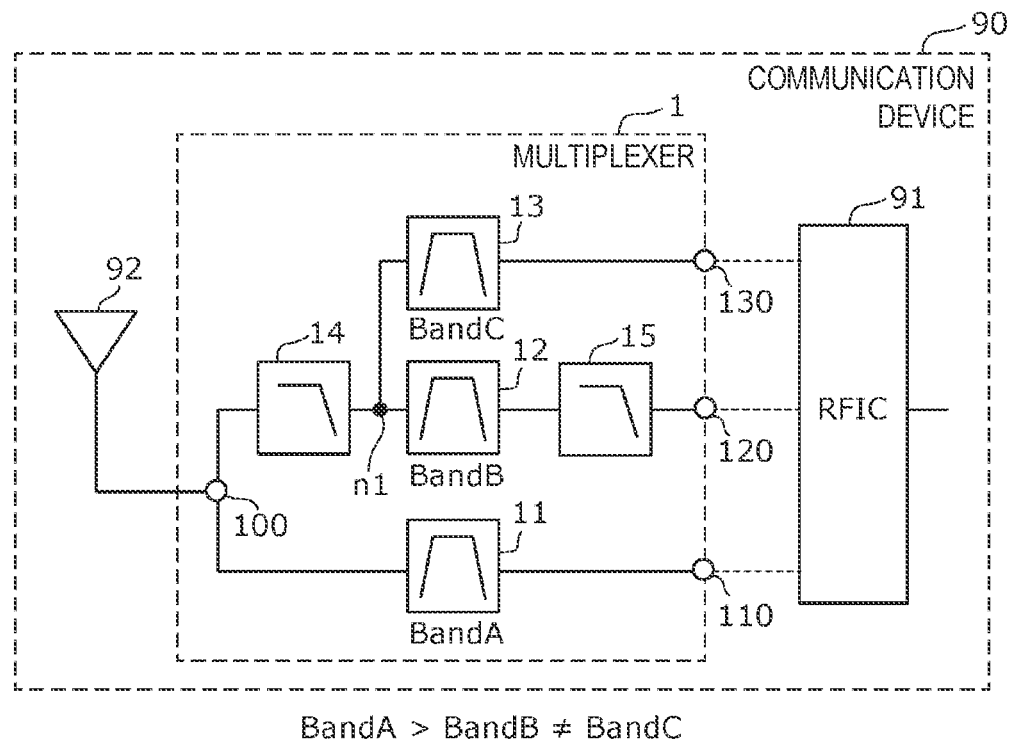
FIG. 1A is a circuit block diagram of a multiplexer and a communication device according to Embodiment 1.

Embodiments of the present disclosure are described in detail below by using the drawings. Note that embodiments, examples, and modifications described below each represents a generic or specific example. Numerical values, shapes, materials, components, arrangements and connection modes of the components, and so forth described in the embodiments, examples, and modifications below are merely examples and are not meant to limit the present disclosure. Of the components in the embodiments, examples, and modifications below, components not described in independent claims are described as optional components. Also, the size of a component depicted in the drawings and a ratio in size are not necessarily strict.

Also, in the following, a "signal path" means a transmission line configured of a wire where a high-frequency signal is propagated, an electrode directly connected to the wire, a terminal directly connected to the wire or the electrode, and so forth.

Embodiment 1

[1.1 Structure of Multiplexer 1 and Communication Device 90]

FIG. 1A is a circuit block diagram of a multiplexer 1 and a communication device 90 according to Embodiment 1. As depicted in FIG. 1A, the communication device 90 includes the multiplexer 1, an antenna 92, and an RF signal processing circuit (RFIC) 91.

The RFIC 91 is one example of an RF signal processing circuit which processes a high-frequency signal transmitted from and received at the antenna 92. Specifically, the RFIC 91 performs signal processing, such as down conversion, on a reception signal inputted via the multiplexer 1, and outputs the reception signal generated by the signal processing to a baseband signal processing circuit (BBIC: not depicted). Also, the RFIC 91 outputs a transmission signal processed based on a signal inputted from the BBIC toward the multiplexer 1.

The antenna 92 is connected to a common terminal 100 of the multiplexer 1, emits a high-frequency signal outputted from the multiplexer 1, and also receives a high-frequency signal from outside for output to the multiplexer 1.

Note that on a signal path connecting the multiplexer 1 and the RFIC 91, an amplifier, a switch, a filter, and so forth may be arranged as appropriate, depending on the number of signals to be transmitted over the signal path and the frequency band.

The multiplexer 1 is arranged between the antenna 92 and the RFIC 91, separates the reception signal inputted from the antenna 92, and also multiplexes the transmission signal inputted from the RFIC 91.

[1.2 Structure of Multiplexer 1 According to Embodiment 1]

Next, a detailed structure of the multiplexer 1 is described. As depicted in FIG. 1A, the multiplexer 1 includes the common terminal 100, input/output terminals 110, 120, and 130, filters 11, 12, and 13, and low pass filters 14 and 15.

The common terminal 100 is connected to the antenna 92. Note that the common terminal 100 does not have to be directly connected to the antenna 92 and a switch, an impedance matching circuit, a circulator, a power splitter, and so forth may be interposed between the antenna 92 and the common terminal 100.

The filter 11 is one example of a first filter, and is a filter taking a first frequency band as a pass band. The filter 12 is one example of a second filter, and is a filter taking a second frequency band as a pass band and a third frequency band as an attenuation band. The filter 13 is one example of a third filter, and is a filter taking the third frequency band as a pass band and the first frequency band and the second frequency band as attenuation bands.

Note that the first frequency band is, for example, a frequency band including a communication band A, the second frequency band is, for example, a frequency band including a communication band B, and the third frequency band is, for example, a frequency band including a communication band C.

The low pass filter 14 is one example of a fourth filter, and is a low-pass-type filter taking the second frequency band and the third frequency band as pass bands and the first frequency band as an attenuation band.

The low pass filter 15 is one example of a fifth filter, and is a low-pass-type filter taking the second frequency band and the third frequency band as pass bands and the first frequency band as an attenuation band.

Here, the second frequency band and the third frequency band are at least partially different in frequency. Also, the first frequency band does not overlap, in frequency, the second frequency band and the third frequency band, and is positioned on a high-frequency side with respect to the second frequency band and the third frequency band.

One end of the filter 11 is connected to the common terminal 100, and the other end of the filter 11 is connected to the input/output terminal 110. Also, one end of the low pass filter 14 is connected to the common terminal 100, and the other end of the low pass filter 14 is connected to one end of the filter 12. The other end of the filter 12 is connected to one end of the low pass filter 15, and the other end of the low pass filter 15 is connected to the input/output terminal 120. Also, one end of the filter 13 is connected to a connection node n1 between the other end of the low pass filter 14 and the one end of the filter 12, and the other end of the filter 13 is connected to the input/output terminal 130.

[1.3 Specific Structure of Multiplexer 1A According to Example 1]

Figure 1B:
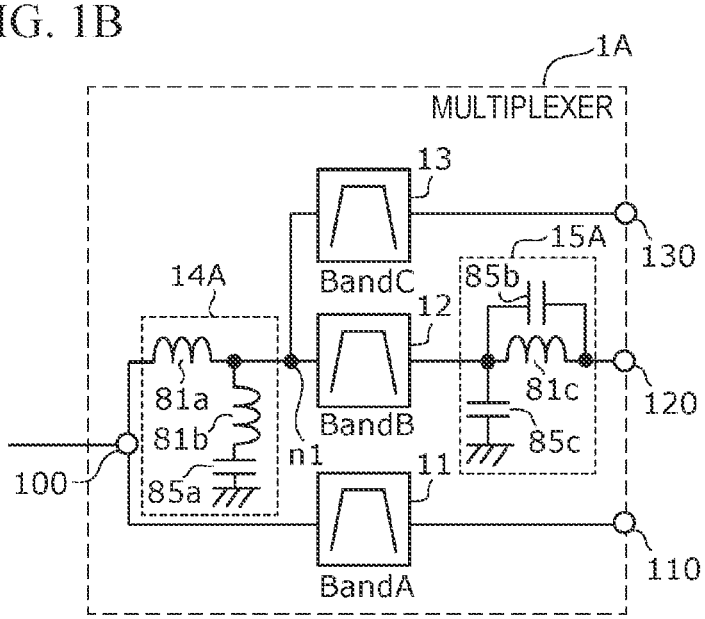
FIG. 1B is a circuit structure diagram of a multiplexer according to Example 1.

FIG. 1B is a circuit structure diagram of a multiplexer 1A according to Example 1. The multiplexer 1A according to Example 1 discloses a specific circuit structure example of the low pass filters 14 and 15 of the multiplexer 1 according to Embodiment 1. The multiplexer 1A includes the common terminal 100, the input/output terminals 110, 120, and 130, the filters 11, 12, and 13, and low pass filters 14A and 15A.

The low pass filter 14A has inductors 81a and 81b and a capacitor 85a. The inductor 81a is arranged in series with a signal path connecting the common terminal 100 and the node n1. A series connection circuit of the inductor 81b and the capacitor 85a is connected between the ground and a node on a signal path connecting the inductor 81a and the node n1. That is, the low pass filter 14A has a low pass function mainly by the inductor 81a arranged on a series arm and the capacitor 85a arranged on a parallel arm.

The low pass filter 15A has an inductor 81c and capacitors 85b and 85c. A parallel connection circuit of the inductor 81c and the capacitor 85b is arranged in series with a signal path connecting the filter 12 and the input/output terminal 120. The capacitor 85c is connected between the ground and a node on the signal path connecting the above-described parallel connection circuit and the filter 12. That is, the low pass filter 15A has a low pass function mainly by the inductor 81c arranged on a series arm and the capacitor 85c arranged on a parallel arm.

Figure 1C:
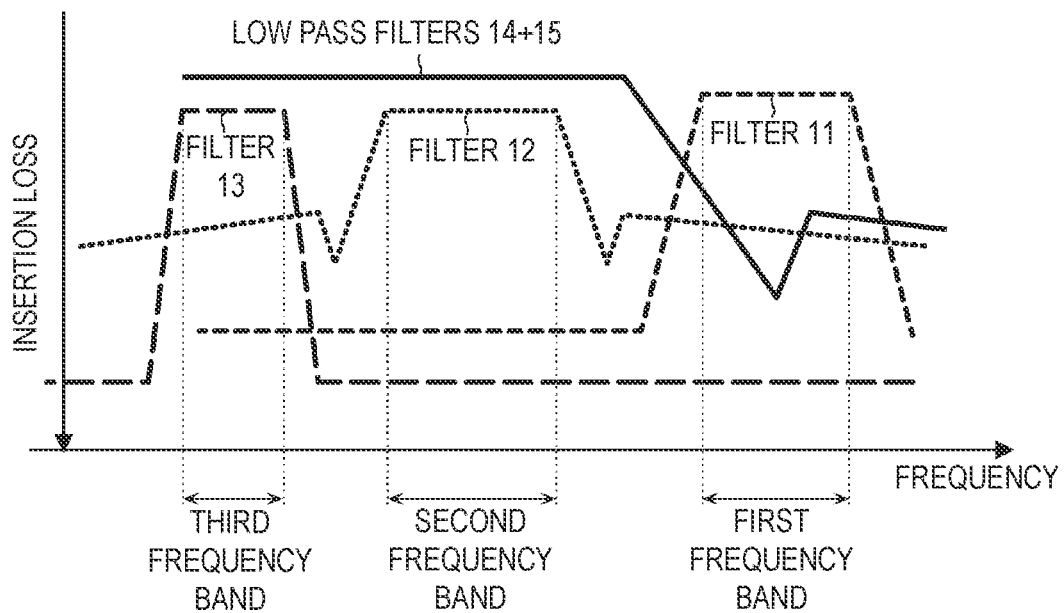
FIG. 1C is a diagram depicting a general outline of bandpass characteristics of each filter included in the multiplexer according to Example 1.

FIG. 1C is a diagram depicting a general outline of bandpass characteristics of each filter included in the multiplexer 1A according to Example 1. The filter 11 is a band-pass-type filter taking the first frequency band as a pass band and the second frequency band and the third frequency band as attenuation bands, the filter 12 is a band-pass-type filter taking the second frequency band as a pass band, and the filter 13 is a band-pass-type filter taking the third frequency band as a pass band. As depicted in FIG. 1C, in the present example, from a high-frequency side, (the pass band of) the filter 11, (the pass band of) the filter 12, and (the pass band of) the filter 13 are present in this order. That is, from the high-frequency side, the first frequency band, the second frequency band, and the third frequency band are positioned in this order. Also, as depicted in FIG. 1C, the bandpass characteristics of a circuit in which the low pass filter 14 and the low pass filter 15 are connected in series take the pass band of the filter 12 (second frequency band) and the pass band of the filter 13 (third frequency band) as pass bands and the pass band of the filter 11 (first frequency band) as an attenuation band.

Figure 2A:
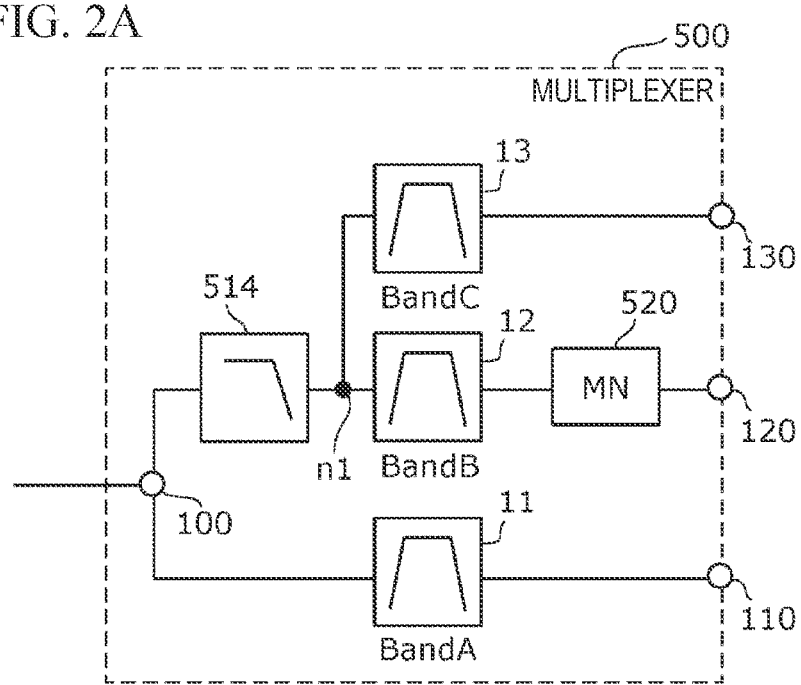
FIG. 2A is a circuit block diagram of a multiplexer according to Comparative Example 1.
Figure 2B:
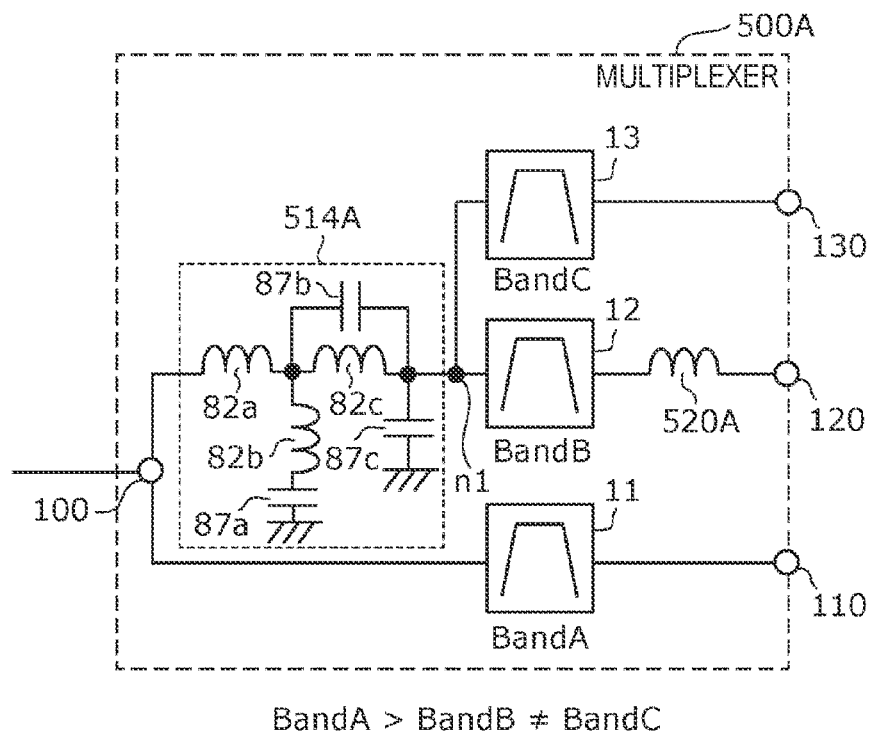
FIG. 2B is a circuit structure diagram of a multiplexer according to Comparative Example 1.

FIG. 2A is a circuit block diagram of a multiplexer 500 according to Comparative Example 1. FIG. 2B is a circuit structure diagram of a multiplexer 500A according to Comparative Example 1.

The multiplexer 500 depicted in FIG. 2A includes the common terminal 100, the input/output terminals 110, 120, and 130, the filters 11, 12, and 13, a low pass filter 514, and an impedance matching circuit 520. The multiplexer 500 according to Comparative Example 1 is different compared with the multiplexer 1 according to Embodiment 1 in that the bandpass characteristics of the low pass filter 514 are different and also the low pass filter 15 is not arranged subsequently to the filter 12 and the impedance matching circuit 520 is arranged instead. As for the multiplexer 500 according to Comparative Example 1, description of the same points as those of the multiplexer 1 according to Embodiment 1 is omitted, and different points are mainly described below.

The low pass filter 514 is a low-pass-type filter taking the second frequency band and the third frequency band as pass bands and the first frequency band as an attenuation band. Note that the low pass filter 514 has bandpass characteristics equivalent to those of the series connection circuits of the low pass filters 14 and 15 included in the multiplexer 1 according to Embodiment 1. That is, attenuation in the first frequency band of the low pass filter 514 is larger than attenuation in the first frequency band of the low pass filter 14 and larger than attenuation in the first frequency band of the low pass filter 15. Meanwhile, insertion loss in the second frequency band and the third frequency band of the low pass filter 514 is larger than insertion loss in the second frequency band and the third frequency band of the low pass filter 14, and is larger than insertion loss in the second frequency band and the third frequency band of the low pass filter 15.

One end of the filter 11 is connected to the common terminal 100, and the other end of the filter 11 is connected to the input/output terminal 110. Also, one end of the low pass filter 514 is connected to the common terminal 100, and the other end of the low pass filter 514 is connected to one end of the filter 12. The other end of the filter 12 is connected to one end of the impedance matching circuit 520, and the other end of the impedance matching circuit 520 is connected to the input/output terminal 120. Also, one end of the filter 13 is connected to the connection node n1 between the other end of the low pass filter 514 and the one end of the filter 12, and the other end of the filter 13 is connected to the input/output terminal 130.

FIG. 2B is a circuit structure diagram of the multiplexer 500A according to Comparative Example 1. The multiplexer 500A depicted in FIG. 2B depicts a specific circuit structure of the low pass filter 514 of the multiplexer 500A depicted in FIG. 2A.

A low pass filter 514A has inductors 82a, 82b, and 82c and capacitors 87a, 87b, and 87c. The inductor 82a is arranged in series with a signal path connecting the common terminal 100 and the node n1. A series connection circuit of the inductor 82b and the capacitor 87a is connected between the ground and a node on a signal path connecting the inductor 82a and the node n1. Also, a parallel connection circuit of the inductor 82c and the capacitor 87b is arranged in series with a signal path connecting the common terminal 100 and the node n1. The capacitor 87c is connected between the ground and a node on a signal path connecting the above-described parallel connection circuit and the node n1. That is, the low pass filter 514A has a low pass function mainly by the inductor 82a arranged on a series arm and the capacitor 87a arranged on a parallel arm, has a low pass function by the inductor 82c arranged on a series arm and the capacitor 87c arranged on a parallel arm, and has bandpass characteristics equivalent to those of the series connection circuits of the low pass filters 14 and 15 included in the multiplexer 1 according to Embodiment 1.

Also, the impedance matching circuit 520 is configured of an inductor 520A arranged in series.

According to the above-described structure of the multiplexer 500 (and 500A) of Comparative Example 1, isolation between the filter 11 and the filters 12 and 13 can be ensured by the low pass filter 514. Here, as depicted in FIG. 1C, since the filter 12 has a low function of attenuating the first frequency band (attenuation in the first frequency band is small), the low pass filter 514 is required on a second signal path connecting the common terminal 100 and the input/output terminal 120. On the other hand, as depicted in FIG. 1C, the filter 13 has a high function of attenuating the first frequency band (attenuation in the first frequency band is large) compared with the filter 12. Thus, when the low pass filter 514 is arranged on a third signal path connecting the common terminal 100 and the input/output terminal 130, the function of attenuating the first frequency band is excessive (overspec). Accordingly, since the low pass filter 514 is arranged on the third signal path, transmission loss in the third signal path is degraded. That is, a difference in attenuation required for the first frequency band occurs between two filters 12 and 13 commonly connected to the low pass filter 514, thereby posing a problem of degradation in transmission loss of the third signal path where the filter 13 is arranged.

By contrast, according to the structure of the multiplexer 1A of Example 1, the low pass filter 14 is connected between the filters 12 and 13 and the common terminal 100, and the low pass filter 15 is connected to the other end of the filter 12. That is, the filter function of allowing passage through the second frequency band and the third frequency band and attenuating the first frequency band is arranged prior to the filters 12 and 13 (between the common terminal 100 and the filters 12 and 13) and subsequently to the filter 12 (between the filter 12 and the input/output terminal 120) in a divided manner. Here, the low pass filter 14 has a function of shifting impedance in the first frequency band when the filter 12 is viewed from the common terminal 100 and impedance in the first frequency band when the filter 13 is viewed from the common terminal 100 to an open side. In other words, the low pass filter 14 has a function of increasing a reflection coefficient in the first frequency band of the second signal path and the third signal path. Also, the low pass filter 14 has a function of increasing attenuation in the first frequency band of the second signal path and the third signal path. Meanwhile, the low pass filter 15 has a function of increasing a reflection coefficient in the first frequency band of the second signal path and the third signal path. Also, the low pass filter 15 has a function of increasing attenuation in the first frequency band of the second signal path. Furthermore, the low pass filter 15 also has the function of an impedance matching circuit arranged subsequently to the filter 12. Note that as for the effect of increasing the reflection coefficient in the first frequency band when the filters 12 and 13 are viewed from the common terminal 100, the effect of the low pass filter 15 is lower than that of the low pass filter 14. This is due to the fact that a low pass filter connected nearer to the common terminal 100 has a higher degree of contribution to the effect of increasing the reflection coefficient in the first frequency band.

That is, since the low pass filter 14 is arranged prior to the filters 12 and 13, isolation between the filter 11 and the filters 12 and 13 can be sufficiently ensured. Also, on the third signal path connecting the common terminal 100 and the input/output terminal 130, the low pass filter 14 is arranged, but the low pass filter 15 is not arranged. Thus, compared with the multiplexer 500 in which the filter circuit (low pass filter 514) in which the low pass filters 14 and 15 are connected in series is arranged prior to the filters 12 and 13, transmission loss of the third signal path can be reduced by insertion loss of the low pass filter 15. That is, while isolation between the filter 11 and the filters 12 and 13 is ensured and attenuation in the first frequency band of the second signal path and the third signal path is sufficiently ensured, transmission loss of the third signal path can be reduced. Furthermore, since the low pass filter 15 is arranged subsequently to the filter 12, circuit elements configuring the low pass filter 15 can be used also as impedance matching elements between the filter 12 and circuit elements connected subsequently to the filter 12. That is, in the multiplexer 1 according to Embodiment 1, the impedance matching circuit 520 arranged in the multiplexer 500 according to Comparative Example 1 is not required. Thus, while transmission loss of the multiplexer 1 is reduced, the number of circuit elements can be reduced, and downsizing can be achieved.

[1.4 Specific Structure of Multiplexer 2 According to Modification 1]

Figure 3A:
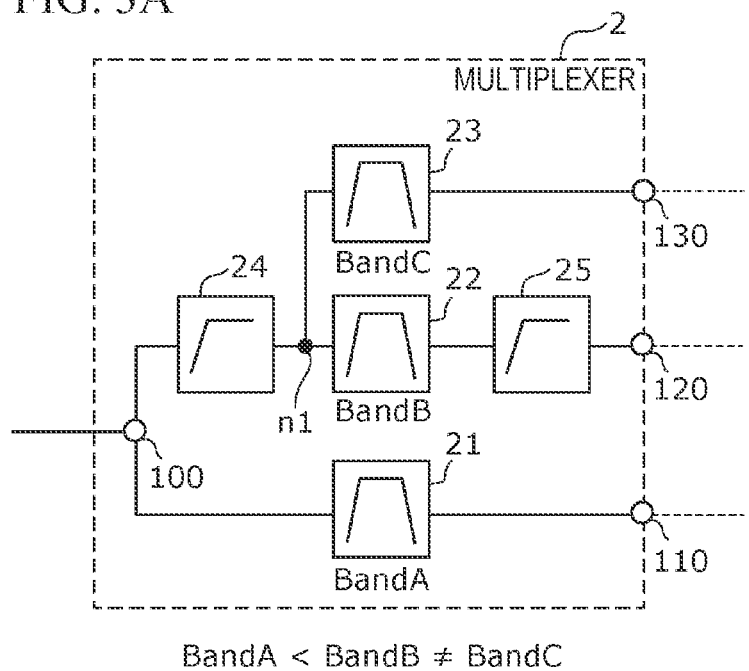
FIG. 3A is a circuit structure diagram of a multiplexer according to Modification 1.

FIG. 3A is a circuit structure diagram of a multiplexer 2 according to Modification 1. The multiplexer 2 includes the common terminal 100, the input/output terminals 110, 120, and 130, filters 21, 22, and 23, and high pass filters 24 and 25. The multiplexer 2 according to Modification 1 is different compared with the multiplexer 1 according to Embodiment 1 in that the frequency relation among the first frequency band, the second frequency band, and the third frequency band is different and high pass filters are arranged in place of low pass filters. As for the multiplexer 2 according to Modification 1, description of the same points as those of the multiplexer 1 according to Embodiment 1 is omitted, and different points are mainly described below.

The filter 21 is one example of a first filter, and is a filter taking a first frequency band as a pass band and a second frequency band and a third frequency band as attenuation bands. The filter 22 is one example of a second filter, and is a filter taking the second frequency band as a pass band and the third frequency band as an attenuation band. The filter 23 is one example of a third filter, and is a filter taking the third frequency band as a pass band and the first frequency band and the second frequency band as attenuation bands.

The high pass filter 24 is one example of a fourth filter, and is a high-pass-type filter taking the second frequency band and the third frequency band as pass bands and the first frequency band as an attenuation band.

The high pass filter 25 is one example of a fifth filter, and is a high-pass-type filter taking the second frequency band and the third frequency band as pass bands and the first frequency band as an attenuation band.

Here, the second frequency band and the third frequency band are at least partially different in frequency. Also, the first frequency band does not overlap, in frequency, the second frequency band and the third frequency band, and is positioned on a low-frequency side with respect to the second frequency band and the third frequency band.

One end of the filter 21 is connected to the common terminal 100, and the other end of the filter 21 is connected to the input/output terminal 110. Also, one end of the high pass filter 24 is connected to the common terminal 100, and the other end of the high pass filter 24 is connected to one end of the filter 22. The other end of the filter 22 is connected to one end of the high pass filter 25, and the other end of the high pass filter 25 is connected to the input/output terminal 120. Also, one end of the filter 23 is connected to a connection node n1 between the other end of the high pass filter 24 and the one end of the filter 22, and the other end of the filter 23 is connected to the input/output terminal 130.

Figure 3B:
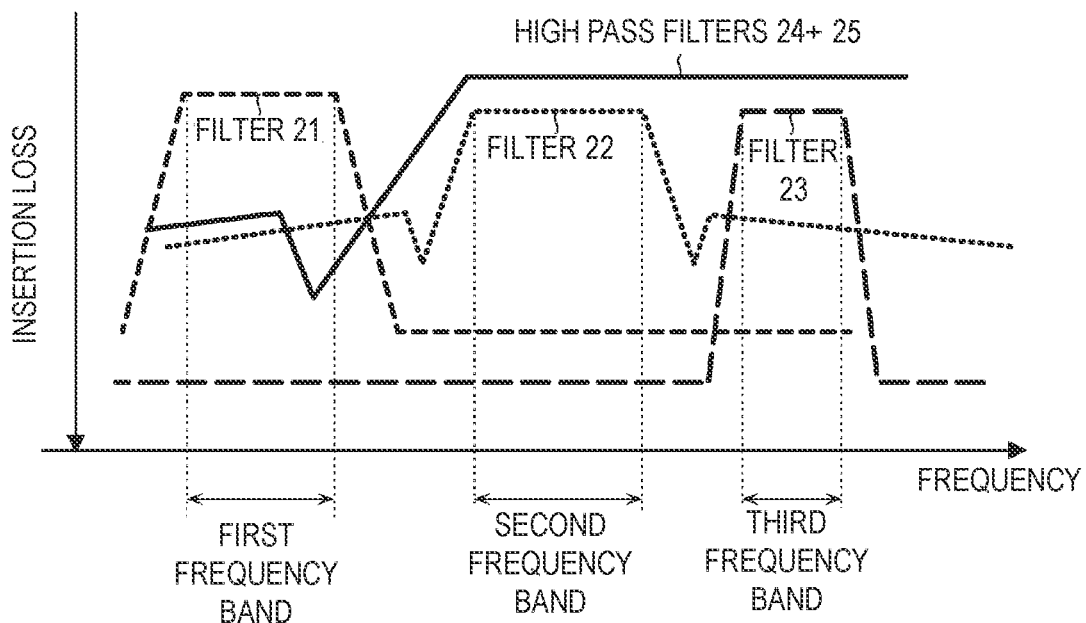
FIG. 3B is a diagram depicting a general outline of bandpass characteristics of each filter included in the multiplexer according to Modification 1.

FIG. 3B is a diagram depicting a general outline of bandpass characteristics of each filter included in the multiplexer 2 according to Modification 1. The filter 21 is a band-pass-type filter taking the first frequency band as a pass band, the filter 22 is a band-pass-type filter taking the second frequency band as a pass band, and the filter 23 is a band-pass-type filter taking the third frequency band as a pass band. As depicted in FIG. 3B, in the present modification, from a low-frequency side, (the pass band of) the filter 21, (the pass band of) the filter 22, and (the pass band of) the filter 23 are present in this order. That is, from the low-frequency side, the first frequency band, the second frequency band, and the third frequency band are positioned in this order. Also, as depicted in FIG. 3B, the bandpass characteristics of a circuit in which the high pass filter 24 and the high pass filter 25 are connected in series take the pass band of the filter 22 (second frequency band) and the pass band of the filter 23 (third frequency band) as pass bands and the pass band of the filter 21 (first frequency band) as an attenuation band.

According to the structure of the multiplexer 2 of the present modification, the high pass filter 24 is connected between the filters 22 and 23 and the common terminal 100, and the high pass filter 25 is connected to the other end of the filter 22. That is, the filter function of allowing passage through the second frequency band and the third frequency band and attenuating the first frequency band is arranged prior to the filters 22 and 23 (between the common terminal 100 and the filters 22 and 23) and subsequently to the filter 22 (between the filter 22 and the input/output terminal 120) in a divided manner. Here, the high pass filter 24 has a function of shifting impedance in the first frequency band when the filter 22 is viewed from the common terminal 100 and impedance in the first frequency band when the filter 23 is viewed from the common terminal 100 to an open side. In other words, the high pass filter 24 has a function of increasing a reflection coefficient in the first frequency band of the second signal path and the third signal path. Also, the high pass filter 24 has a function of increasing attenuation in the first frequency band of the second signal path and the third signal path. Meanwhile, the high pass filter 25 has a function of increasing a reflection coefficient in the first frequency band of the second signal path and the third signal path. Also, the high pass filter 25 has a function of increasing attenuation in the first frequency band of the second signal path. Furthermore, the high pass filter 25 also has the function of an impedance matching circuit arranged subsequently to the filter 22. Note that as for the effect of increasing the reflection coefficient in the first frequency band when the filters 22 and 23 are viewed from the common terminal 100, the effect of the high pass filter 25 is lower than that of the high pass filter 24. This is due to the fact that a high pass filter connected nearer to the common terminal 100 has a higher degree of contribution to the effect of increasing the reflection coefficient in the first frequency band.

That is, since the high pass filter 24 is arranged prior to the filters 22 and 23, isolation between the filter 21 and the filters 22 and 23 can be sufficiently ensured. Also, on the third signal path connecting the common terminal 100 and the input/output terminal 130, the high pass filter 24 is arranged, but the high pass filter 25 is not arranged. Thus, compared with the multiplexer in which the filter circuit in which the high pass filters 24 and 25 are connected in series is arranged prior to the filters 22 and 23, transmission loss of the third signal path can be reduced by insertion loss of the high pass filter 25. That is, while isolation between the filter 21 and the filters 22 and 23 is ensured and attenuation in the first frequency band of the second signal path and the third signal path is sufficiently ensured, transmission loss of the third signal path can be reduced. Furthermore, since the high pass filter 25 is arranged subsequently to the filter 22, circuit elements configuring the high pass filter 25 can be used also as impedance matching elements between the filter 22 and circuit elements connected subsequently to the filter 22. That is, in the multiplexer 2 according to Modification 1, the impedance matching circuit 520 arranged in the multiplexer 500 according to Comparative Example 1 is not required. Thus, while transmission loss of the multiplexer 2 is reduced, the number of circuit elements can be reduced, and downsizing can be achieved.

[1.5 Specific Structure of Multiplexer 3 According to Modification 2]

Figure 4A:
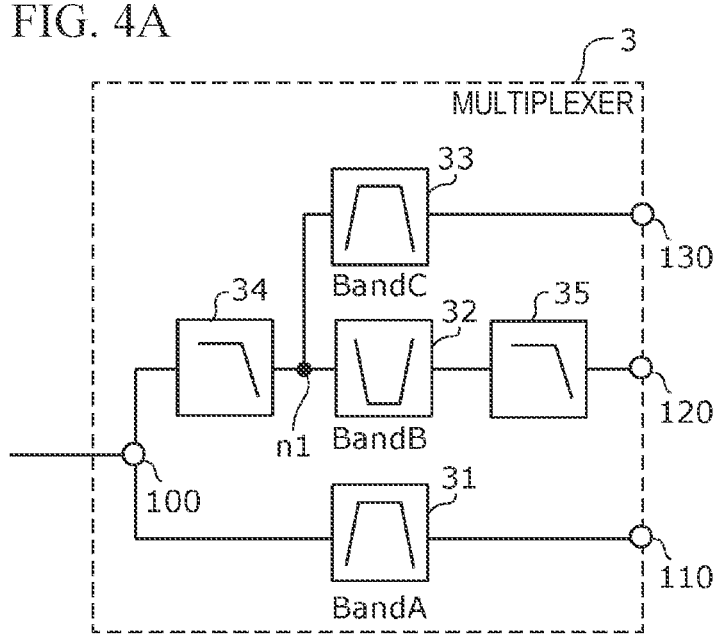
FIG. 4A is a circuit block diagram of a multiplexer according to Modification 2.

FIG. 4A is a circuit structure diagram of a multiplexer 3 according to Modification 2. The multiplexer 3 includes the common terminal 100, the input/output terminals 110, 120, and 130, filters 31, 32, and 33, and low pass filters 34 and 35. The multiplexer 3 according to Modification 2 is different compared with the multiplexer 1 according to Embodiment 1 in that the filter 32 is not a band pass filter but a band elimination filter. As for the multiplexer 3 according to Modification 2, description of the same points as those of the multiplexer 1 according to Embodiment 1 is omitted, and different points are mainly described below.

The filter 31 is one example of a first filter, and is a filter taking a first frequency band as a pass band and a second frequency band and a third frequency band as attenuation bands. The filter 32 is one example of a second filter, and is a band elimination filter taking the third frequency band as an attenuation band. The filter 33 is one example of a third filter, and is a filter taking the third frequency band as a pass band and the first frequency band and the second frequency band as attenuation bands. The filter 32 and the filter 33 each takes the third frequency band as an attenuation band and a pass band, configuring an extractor.

The low pass filter 34 is one example of a fourth filter, and is a low-pass-type filter taking the second frequency band and the third frequency band as pass bands and the first frequency band as an attenuation band.

The low pass filter 35 is one example of a fifth filter, and is a low-pass-type filter taking the second frequency band and the third frequency band as pass bands and the first frequency band as an attenuation band.

Here, the second frequency band and the third frequency band are at least partially different in frequency. Also, the first frequency band does not overlap, in frequency, the second frequency band and the third frequency band, and is positioned on a high-frequency side with respect to the second frequency band and the third frequency band.

One end of the filter 31 is connected to the common terminal 100, and the other end of the filter 31 is connected to the input/output terminal 110. Also, one end of the low pass filter 34 is connected to the common terminal 100, and the other end of the low pass filter 34 is connected to one end of the filter 32. The other end of the filter 32 is connected to one end of the low pass filter 35, and the other end of the low pass filter 35 is connected to the input/output terminal 120. Also, one end of the filter 33 is connected to a connection node n1 between the other end of the low pass filter 34 and the one end of the filter 32, and the other end of the filter 33 is connected to the input/output terminal 130.

Figure 4B:
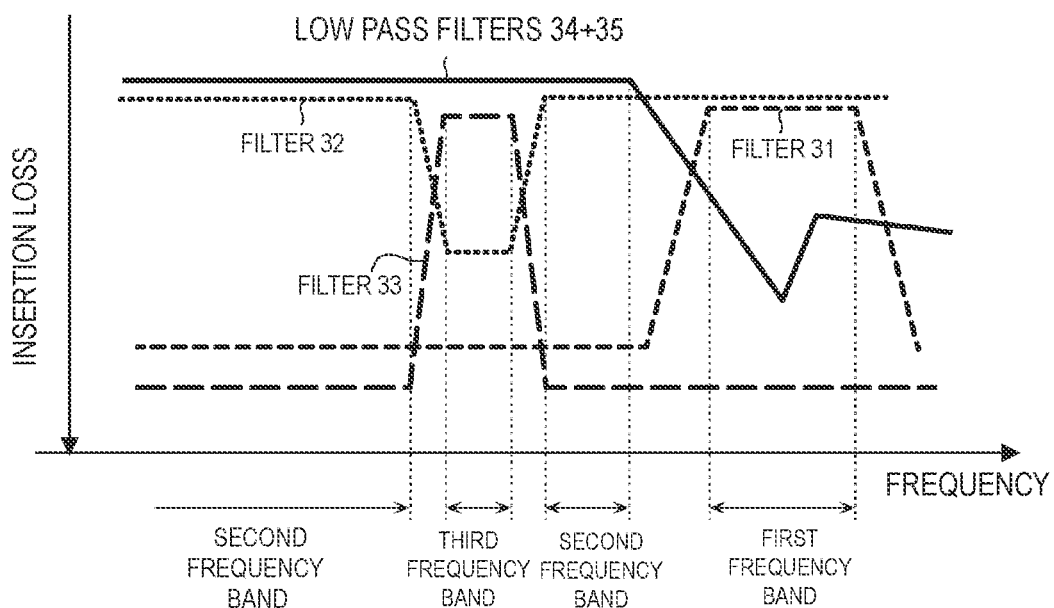
FIG. 4B is a diagram depicting a general outline of bandpass characteristics of each filter included in the multiplexer according to Modification 2.

FIG. 4B is a diagram depicting a general outline of bandpass characteristics of each filter included in the multiplexer 3 according to Modification 2. The filter 31 is a band-pass-type filter taking the first frequency band as a pass band, the filter 32 is a band elimination filter taking the third frequency band as an attenuation band, and the filter 33 is a band-pass-type filter taking the third frequency band as a pass band. As depicted in FIG. 4B, in the present modification, from a high-frequency side, (the pass band of) the filter 31, (part of the pass band of) the filter 32, (the pass band of) the filter 33, and (the other part of the pass band of) the filter 32 are present in this order. That is, from the high-frequency side, the first frequency band, part of the second frequency band, the third frequency band, and the other part of the second frequency band are positioned in this order. Also, as depicted in FIG. 4B, the bandpass characteristics of a circuit in which the low pass filter 34 and the low pass filter 35 are connected in series take the pass band of the filter 32 (second frequency band) and the pass band of the filter 33 (third frequency band) as pass bands and the pass band of the filter 31 (first frequency band) as an attenuation band. Here, since the filter 32 is a band elimination filter taking the third frequency band as an attenuation band, the function of attenuating the first frequency band is low (attenuation in the first frequency band is small). Thus, the low pass filters 34 and 35 are required on the second signal path connecting the common terminal 100 and the input/output terminal 120. On the other hand, since the filter 33 is a band pass filter taking the third frequency band as a pass band, the function of attenuating the first frequency band is high (attenuation in the first frequency band is large) compared with the filter 32. Thus, when the low pass filters 34 and 35 are both arranged on the third signal path connecting the common terminal 100 and the input/output terminal 130, the function of attenuating the first frequency band is excessive (overspec).

According to the structure of the multiplexer 3 of the present modification, the low pass filter 34 is connected between the filters 32 and 33 and the common terminal 100, and the low pass filter 35 is connected to the other end of the filter 32. That is, the filter function of allowing passage through the second frequency band and the third frequency band and attenuating the first frequency band is arranged prior to the filters 32 and 33 (between the common terminal 100 and the filters 32 and 33) and subsequently to the filter 32 (between the filter 32 and the input/output terminal 120) in a divided manner. Here, the low pass filter 34 has a function of shifting impedance in the first frequency band when the filter 32 is viewed from the common terminal 100 and impedance in the first frequency band when the filter 33 is viewed from the common terminal 100 to an open side. In other words, the low pass filter 34 has a function of increasing a reflection coefficient in the first frequency band of the second signal path and the third signal path. Also, the low pass filter 34 has a function of increasing attenuation in the first frequency band of the second signal path and the third signal path. Meanwhile, the low pass filter 35 has a function of increasing a reflection coefficient in the first frequency band of the second signal path and the third signal path. Also, the low pass filter 35 has a function of increasing attenuation in the first frequency band of the second signal path. Furthermore, the low pass filter 35 also has the function of an impedance matching circuit arranged subsequently to the filter 32. Note that as for the effect of increasing the reflection coefficient in the first frequency band when the filters 32 and 33 are viewed from the common terminal 100, the effect of the low pass filter 35 is lower than that of the low pass filter 34. This is due to the fact that a low pass filter connected nearer to the common terminal 100 has a higher degree of contribution to the effect of increasing the reflection coefficient in the first frequency band.

That is, since the low pass filter 34 is arranged prior to the filters 32 and 33, isolation between the filter 31 and the filters 32 and 33 can be sufficiently ensured. Also, on the third signal path connecting the common terminal 100 and the input/output terminal 130, the low pass filter 34 is arranged, but the low pass filter 35 is not arranged. Thus, compared with the multiplexer in which the filter circuit in which the low pass filters 34 and 35 are connected in series is arranged prior to the filters 32 and 33, transmission loss of the third signal path can be reduced by insertion loss of the low pass filter 35. That is, while isolation between the filter 31 and the filters 32 and 33 is ensured and attenuation in the first frequency band of the second signal path and the third signal path is sufficiently ensured, transmission loss of the third signal path can be reduced. Furthermore, since the low pass filter 35 is arranged subsequently to the filter 32, circuit elements configuring the low pass filter 35 can be used also as impedance matching elements between the filter 32 and circuit elements connected subsequently to the filter 32. That is, in the multiplexer 3 according to Modification 2, the impedance matching circuit 520 arranged in the multiplexer 500 according to Comparative Example 1 is not required. Thus, while transmission loss of the multiplexer 3 is reduced, the number of circuit elements can be reduced, and downsizing can be achieved.

Note that as a modification of the multiplexer 3 according to Modification 2, a multiplexer is also included in the present disclosure in which, in comparison with the multiplexer 3 according to Modification 2, a frequency relation among the first frequency band, the second frequency band, and the third frequency band is different and high pass filters are arranged in place of low pass filters.

That is, in the multiplexer according to the modification of the multiplexer 3, the second frequency band and the third frequency band are at least partially different in frequency, and the first frequency band does not overlap, in frequency, the second frequency band and the third frequency band and is positioned on a low-frequency side with respect to the second frequency band and the third frequency band. Also, in place of the low pass filters 34 and 35 in the multiplexer 3 according to Modification 2, high pass filters taking the second frequency band and the third frequency band as pass bands and the first frequency band as an attenuation band are arranged prior to and subsequently to the filter 32, respectively.

With this, isolation between the filter 31 and the filters 32 and 33 can be sufficiently ensured, transmission loss of the third signal path can be reduced by insertion loss of the high pass filter subsequently arranged, and circuit elements configuring the high pass filter subsequently arranged can be used also as impedance matching elements connected subsequently to the filter 32. Thus, while transmission loss of the multiplexer is reduced, the number of circuit elements can be reduced, and downsizing can be achieved.

Embodiment 2

In Embodiment 1, the multiplexer is described in which low pass filters or high pass filters are arranged prior to and subsequently to the second filter in a divided manner. In the present embodiment, a multiplexer is described which has a structure in which low pass filters and high pass filters are both arranged prior to and subsequently to the second filter in a divided manner.

[2.1 Structure of Multiplexer 4]

Figure 5A:
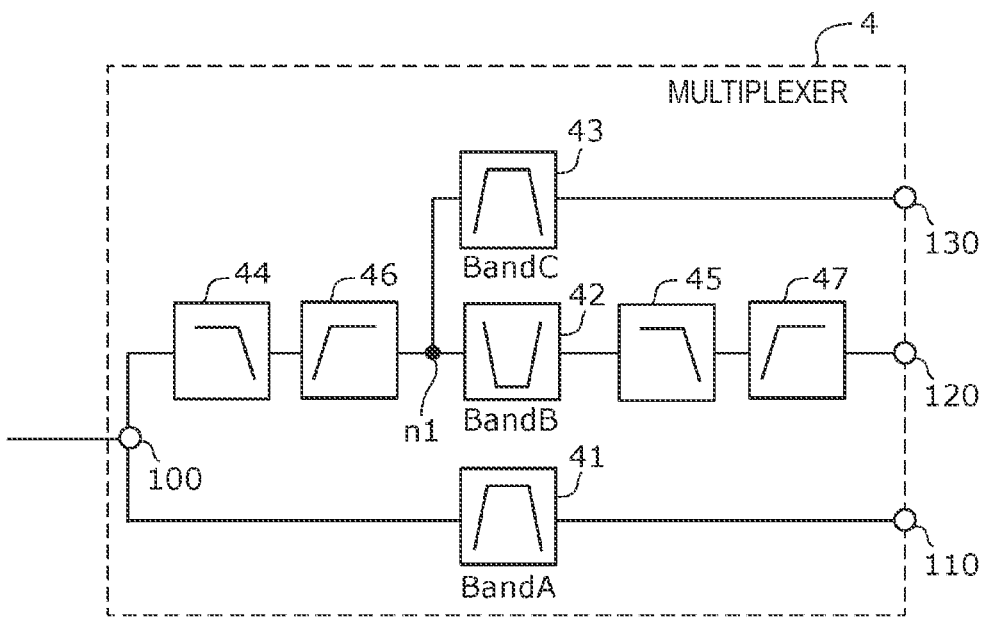
FIG. 5A is a circuit block diagram of a multiplexer according to Embodiment 2.

FIG. 5A is a circuit block diagram of a multiplexer 4 according to Embodiment 2. As depicted in the drawing, the multiplexer 4 includes the common terminal 100, the input/output terminals 110, 120, and 130, filters 41, 42, and 43, low pass filters 44 and 45, and high pass filters 46 and 47.

The filter 41 is one example of a first filter, and is a filter taking a first frequency band as a pass band and a second frequency band and a third frequency band as attenuation bands. The filter 42 is one example of a second filter, and is a band elimination filter taking the third frequency band as an attenuation band. The filter 43 is one example of a third filter, and is a filter taking the third frequency band as a pass band and the first frequency band and the second frequency band as attenuation bands. The filter 42 and the filter 43 each takes the third frequency band as an attenuation band and a pass band, configuring an extractor.

The low pass filter 44 is one example of a sixth filter, and is a low-pass-type filter taking the second frequency band and the third frequency band as pass bands and the first frequency band as an attenuation band.

The high pass filter 46 is one example of a seventh filter, and is a high-pass-type filter taking the second frequency band and the third frequency band as pass bands.

The low pass filter 45 is one example of an eighth filter, and is a low-pass-type filter taking the second frequency band and the third frequency band as pass bands and the first frequency band as an attenuation band.

The high pass filter 47 is one example of a ninth filter, and is a high-pass-type filter taking the second frequency band and the third frequency band as pass bands.

Here, the second frequency band and the third frequency band are at least partially different in frequency. Also, the first frequency band does not overlap, in frequency, the second frequency band and the third frequency band, and is positioned on a high-frequency side with respect to the second frequency band and the third frequency band.

One end of the filter 41 is connected to the common terminal 100, and the other end of the filter 41 is connected to the input/output terminal 110. Also, one end of the low pass filter 44 is connected to the common terminal 100, and the other end of the low pass filter 44 is connected to one end of the high pass filter 46. The other end of the high pass filter 46 is connected to one end of the filter 42. The other end of the filter 42 is connected to one end of the low pass filter 45, and the other end of the low pass filter 45 is connected to one end of the high pass filter 47. The other end of the high pass filter 47 is connected to the input/output terminal 120. Also, one end of the filter 43 is connected to a connection node n1 between the other end of the high pass filter 46 and the one end of the filter 42, and the other end of the filter 43 is connected to the input/output terminal 130.

[2.2 Specific Structure of Multiplexer 4A According to Example 2]

Figure 5B:
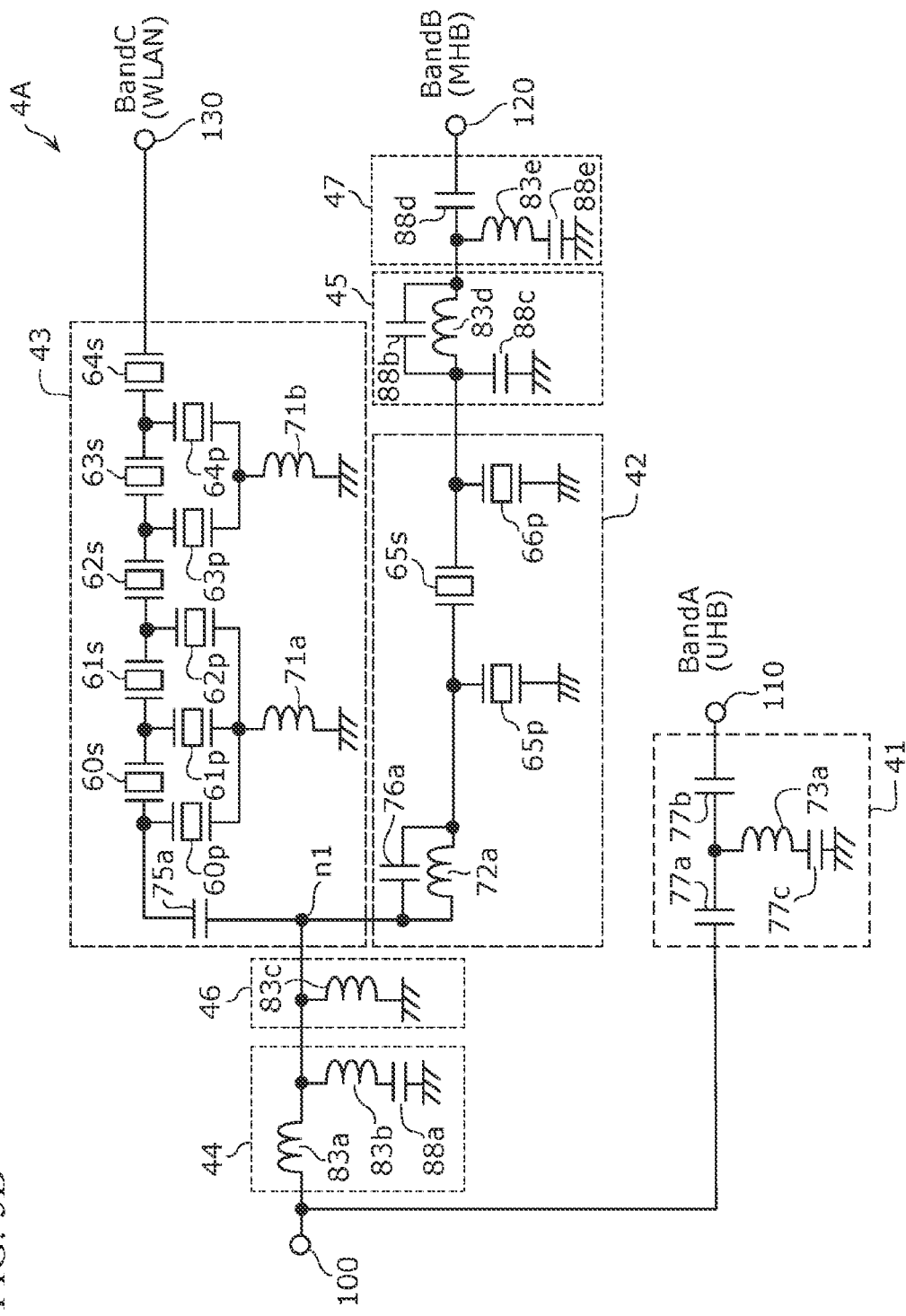
FIG. 5B is a circuit structure diagram of a multiplexer according to Example 2.

FIG. 5B is a circuit structure diagram of a multiplexer 4A according to Example 2. The multiplexer 4A according to Example 2 discloses a specific circuit structure example of the multiplexer 4 according to Embodiment 2. The multiplexer 4A includes the common terminal 100, the input/output terminals 110, 120, and 130, the filters 41, 42, and 43, the low pass filters 44 and 45, and the high pass filters 46 and 47.

The filter 41 has an inductor 73a and capacitors 77a, 77b, and 77c. The capacitors 77a and 77b are each arranged in series with a first signal path connecting the common terminal 100 and the input/output terminal 110. An LC series resonant circuit of the inductor 73a and the capacitor 77c is connected between a connection node of the capacitors 77a and 77b and the ground. With the above-described structure, the filter 41 configures an LC filter taking a first frequency band (communication band A) as a pass band.

The filter 42 has a series-arm resonator 65s, parallel-arm resonators 65p and 66p, an inductor 72a, and a capacitor 76a. The series-arm resonator 65s is an acoustic wave resonator arranged in series with a second signal path connecting the node n1 and the input/output terminal 120. Each of the parallel-arm resonators 65p and 66p is an acoustic wave resonator connected between a node on the second signal path and the ground. An LC parallel resonant circuit of the inductor 72a and the capacitor 76a is arranged in series with the second signal path connecting the node n1 and the series-arm resonator 65s. With the above-described structure, the filter 42 configures a ladder acoustic wave filter taking the third frequency band (communication band C) as an attenuation band.

The filter 43 has series-arm resonators 60s, 61s, 62s, 63s, and 64s, parallel-arm resonators 60p, 61p, 62p, 63p, and 64p, inductors 71a and 71b, and a capacitor 75a. Each of the series-arm resonators 60s to 64s is an acoustic wave resonator arranged in series with a third signal path connecting the node n1 and the input/output terminal 130. Each of the parallel-arm resonators 60p to 64p is an acoustic wave resonator connected between a node on the above-described third signal path and the ground. The inductor 71a is connected between a connection node of the parallel-arm resonators 60p to 62p and the ground. The inductor 71b is connected between a connection node of the parallel-arm resonators 63p and 64p and the ground. The capacitor 75a is arranged in series between the node n1 and the series-arm resonator 60s. With the above-described structure, the filter 43 configures a ladder acoustic wave filter taking the third frequency band (communication band C) as a pass band.

The low pass filter 44 has inductors 83a and 83b and a capacitor 88a. The inductor 83a is arranged in series with a signal path connecting the common terminal 100 and the node n1. A series connection circuit of the inductor 83b and the capacitor 88a is connected between the ground and a node on a signal path connecting the inductor 83a and the node n1. That is, the low pass filter 44 has a low pass function mainly by the inductor 83a arranged on a series arm and the capacitor 88a arranged on a parallel arm.

The high pass filter 46 has an inductor 83c. The inductor 83c is connected between the ground and a node on a signal path connecting the common terminal 100 and the node n1. The high pass filter 46 has a high pass function by the inductor 83c arranged on a parallel arm.

The low pass filter 45 has an inductor 83d and capacitors 88b and 88c. A parallel connection circuit of the inductor 83d and the capacitor 88b is arranged in series with a second signal path connecting the filter 42 and the input/output terminal 120. The capacitor 88c is connected between a node on the second signal path and the ground. That is, the low pass filter 45 has a low pass function mainly by the inductor 83d arranged on a series arm and the capacitor 88c arranged on a parallel arm.

The high pass filter 47 has an inductor 83e and capacitors 88d and 88e. The capacitor 88d is arranged in series with a second signal path connecting the filter 42 and the input/output terminal 120. A series connection circuit of the inductor 83e and the capacitor 88e is connected between a node on the second signal path and the ground. That is, the high pass filter 47 has a high pass function mainly by the capacitor 88d arranged on a series arm and the inductor 83e arranged on a parallel arm.

In the multiplexer 4A according to the present example, the first frequency band (communication band A) is, for example, an ultrahigh band (3300 to 5000 MHz), the second frequency band (communication band B) is, for example, a middle-high band (1710 to 2370 MHz and 2496 to 2690 MHz), and the third frequency band is, for example, of a wireless local area network (WLAN; 2400 to 2483 MHz).

Figure 5C:
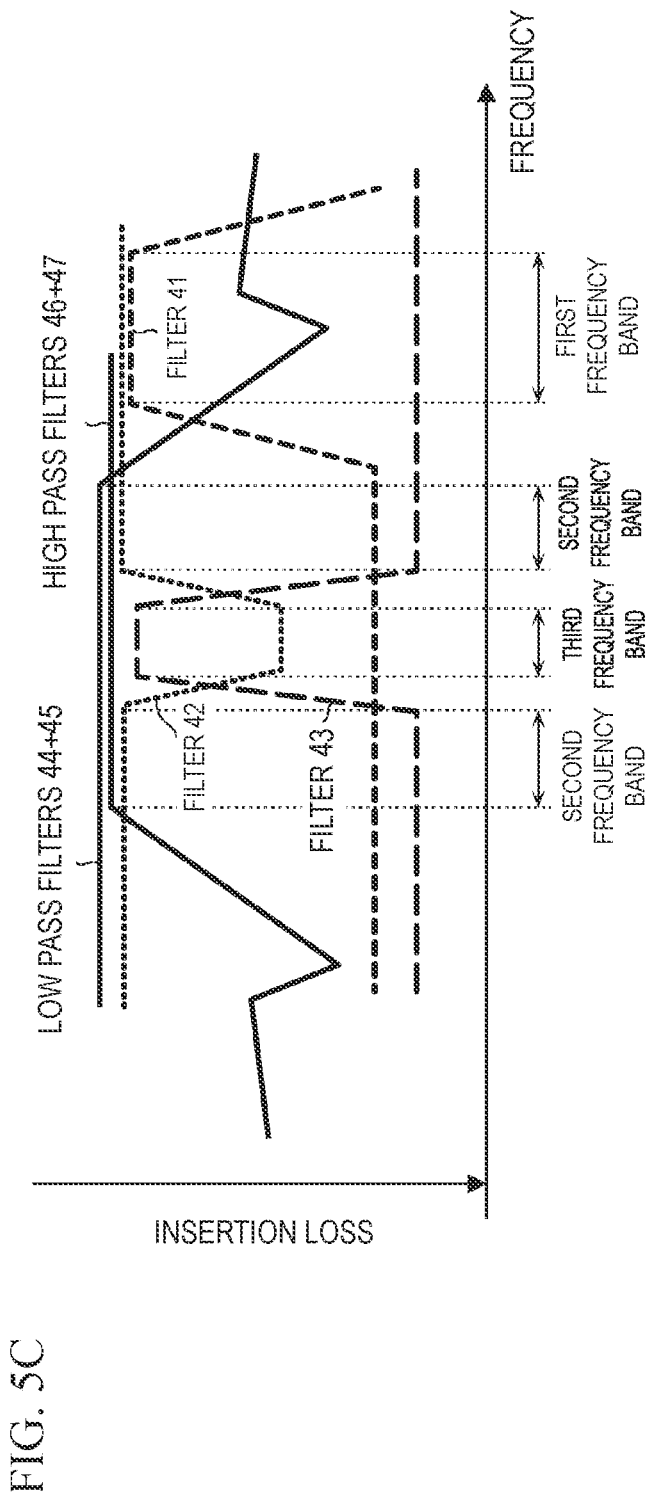
FIG. 5C is a diagram depicting a general outline of bandpass characteristics of each filter included in the multiplexer according to Example 2.

FIG. 5C is a diagram depicting a general outline of bandpass characteristics of each filter included in the multiplexer 4A according to Example 2. The filter 41 is a band-pass-type filter taking the first frequency band as a pass band, the filter 42 is a band elimination filter taking the third frequency band as an attenuation band, and the filter 43 is a band-pass-type filter taking the third frequency band as a pass band. As depicted in FIG. 5C, in the present example, from a high-frequency side, (the pass band of) the filter 41, (part of the pass band of) the filter 42, (the pass band of) the filter 43, and (the other part of the pass band of) the filter 42 are present in this order. That is, from the high-frequency side, the first frequency band, part of the second frequency band, the third frequency band, and the other part of the second frequency band are positioned in this order. Also, as depicted in FIG. 5C, the bandpass characteristics of a circuit in which the low pass filter 44 and the low pass filter 45 are connected in series take the pass band of the filter 42 (second frequency band) and the pass band of the filter 43 (third frequency band) as pass bands and the pass band of the filter 41 (first frequency band) as an attenuation band. Also, the bandpass characteristics of a circuit connecting the high pass filter 46 and the high pass filter 47 in series take the pass band of the filter 42 (second frequency band) and the pass band of the filter 43 (third frequency band) as pass bands. Here, since the filter 42 is a band elimination filter taking the third frequency band as an attenuation band, the function of attenuating the first frequency band is low (attenuation in the first frequency band is small). Thus, the low pass filters 44 and 45 are required on the second signal path connecting the common terminal 100 and the input/output terminal 120. On the other hand, since the filter 43 is a band pass filter taking the third frequency band as a pass band, the function of attenuating the first frequency band is high (attenuation in the first frequency band is large) compared with the filter 42. Thus, when the low pass filters 44 and 45 are arranged on the third signal path connecting the common terminal 100 and the input/output terminal 130, the function of attenuating the first frequency band is excessive (overspec).

Also, since the filter 42 has a low function of attenuating a band on a low-frequency side with respect to the second frequency band and the third frequency band, the high pass filters 46 and 47 are required on the second signal path connecting the common terminal 100 and the input/output terminal 120. On the other hand, since the filter 43 is a band pass filter taking the third frequency band as a pass band, the function of attenuating a band on a low-frequency side with respect to the second frequency band and the third frequency band is high, compared with the filter 42. Thus, when the high pass filters 46 and 47 are arranged on the third signal path connecting the common terminal 100 and the input/output terminal 130, the function of attenuating the first frequency band is excessive (overspec).

According to the structure of the multiplexer 4A of the present example, the low pass filter 44 and the high pass filter 46 are connected between the filters 42 and 43 and the common terminal 100, and the low pass filter 45 and the high pass filter 47 are connected to the other end of the filter 42. That is, a low pass filter function of allowing passage through the second frequency band and the third frequency band and attenuating the first frequency band is arranged prior to the filters 42 and 43 (between the common terminal 100 and the filters 42 and 43) and subsequently to the filter 42 (between the filter 42 and the input/output terminal 120) in a divided manner. Also, the high pass filter function of allowing passage through the second frequency band and the third frequency band and attenuating the band on the low-frequency side with respect to the second frequency band and the third frequency band is arranged prior to the filters 42 and 43 (between the common terminal 100 and the filters 42 and 43) and subsequently to the filter 42 (between the filter 42 and the input/output terminal 120) in a divided manner. Here, the low pass filter 44 has a function of shifting impedance in the first frequency band when the filter 42 is viewed from the common terminal 100 and impedance in the first frequency band when the filter 43 is viewed from the common terminal 100 to an open side. In other words, the low pass filter 44 has a function of increasing a reflection coefficient in the first frequency band of the second signal path and the third signal path. Also, the low pass filter 44 has a function of increasing attenuation in the first frequency band of the second signal path and the third signal path. Meanwhile, the low pass filter 45 has a function of increasing a reflection coefficient in the first frequency band of the second signal path and the third signal path. Also, the low pass filter 45 has a function of increasing attenuation in the first frequency band of the second signal path. Furthermore, the low pass filter 45 also has the function of an impedance matching circuit arranged subsequently to the filter 42. Note that as for the effect of increasing the reflection coefficient in the first frequency band when the filters 42 and 43 are viewed from the common terminal 100, the effect of the low pass filter 45 is lower than that of the low pass filter 44. This is due to the fact that a low pass filter connected nearer to the common terminal 100 has a higher degree of contribution to the effect of increasing the reflection coefficient in the first frequency band.

On the other hand, the high pass filters 46 and 47 have a function of increasing attenuation on a low-frequency side with respect to the first frequency band, the second frequency band, and the third frequency band on the second signal path and the third signal path.

That is, since the low pass filter 44 is arranged prior to the filters 42 and 43, isolation between the filter 41 and the filters 42 and 43 can be sufficiently ensured. Also, on the third signal path connecting the common terminal 100 and the input/output terminal 130, the low pass filter 44 is arranged, but the low pass filter 45 is not arranged. Thus, compared with the multiplexer in which the filter circuit in which the low pass filters 44 and 45 are connected in series is arranged prior to the filters 42 and 43, transmission loss of the third signal path can be reduced by insertion loss of the low pass filter 45. That is, while isolation between the filter 41 and the filters 42 and 43 is ensured and attenuation in the first frequency band of the second signal path and the third signal path is sufficiently ensured, transmission loss of the third signal path can be reduced. Furthermore, since the low pass filter 45 and the high pass filter 47 are arranged subsequently to the filter 42, circuit elements configuring the low pass filter 45 and the high pass filter 47 can be used also as impedance matching elements between the filter 42 and circuit elements connected subsequently to the filter 42. That is, in the multiplexer 4A according to Example 2, it is not required to separately arrange an impedance matching circuit subsequently to the filter 42. Thus, while transmission loss of the multiplexer 4A is reduced, the number of circuit elements can be reduced, and downsizing can be achieved.

[2.3 Specific Structure of Multiplexer 5 According to Modification 3]

Note that as a modification of the multiplexer 4 according to Embodiment 2, a multiplexer is also included in the present disclosure in which the frequency relation among the first frequency band, the second frequency band, and the third frequency band is different.

Figure 6A:
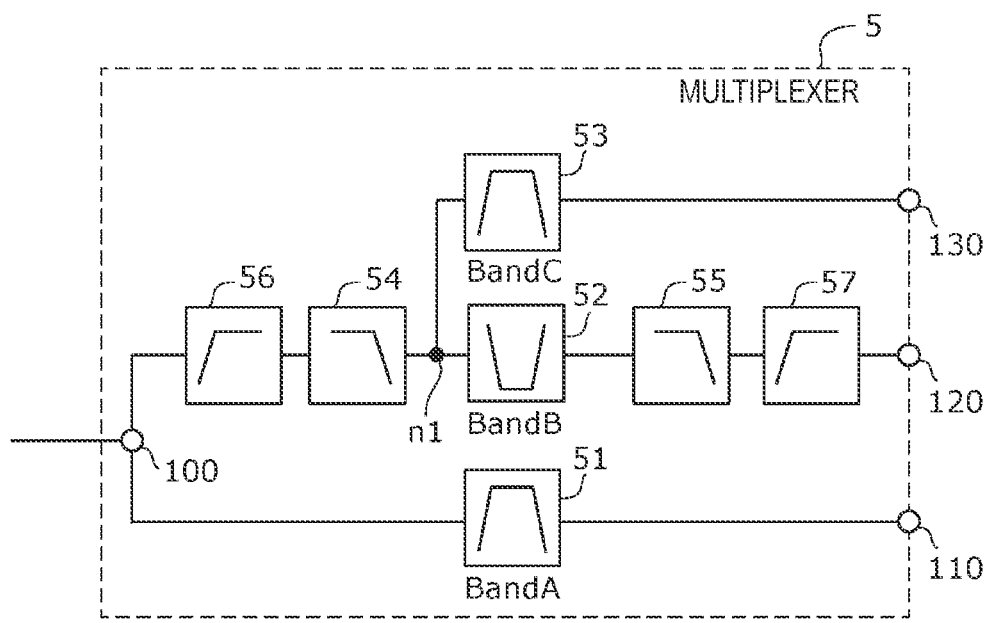
FIG. 6A is a circuit block diagram of a multiplexer according to Modification 3.

FIG. 6A is a circuit structure diagram of a multiplexer 5 according to Modification 3. The multiplexer 5 according to Modification 3 includes the common terminal 100, the input/output terminals 110, 120, and 130, filters 51, 52, and 53, low pass filters 54 and 55, and high pass filters 56 and 57. The multiplexer 5 according to Modification 3 is different compared with the multiplexer 4 according to Embodiment 2 in that the frequency relation among the first frequency band, the second frequency band, and the third frequency band is different. As for the multiplexer 5 according to Modification 3, description of the same points as those of the multiplexer 4 according to Embodiment 2 is omitted, and different points are mainly described below.

The filter 51 is one example of a first filter, and is a filter taking a first frequency band as a pass band and a second frequency band and a third frequency band as attenuation bands. The filter 52 is one example of a second filter, and is a band elimination filter taking the third frequency band as an attenuation band. The filter 53 is one example of a third filter, and is a filter taking the third frequency band as a pass band and the first frequency band and the second frequency band as attenuation bands. The filter 52 and the filter 53 each takes the third frequency band as an attenuation band and a pass band, configuring an extractor.

The low pass filter 54 is one example of a sixth filter, and is a low-pass-type filter taking the second frequency band and the third frequency band as pass bands.

The high pass filter 56 is one example of a seventh filter, and is a high-pass-type filter taking the second frequency band and the third frequency band as pass bands and the first frequency band as an attenuation band.

The low pass filter 55 is one example of an eighth filter, and is a low-pass-type filter taking the second frequency band and the third frequency band as pass bands.

The high pass filter 57 is one example of a ninth filter, and is a high-pass-type filter taking the second frequency band and the third frequency band as pass bands and the first frequency band as an attenuation band.

Here, the second frequency band and the third frequency band are at least partially different in frequency. Also, the first frequency band does not overlap, in frequency, the second frequency band and the third frequency band, and is positioned on a low-frequency side with respect to the second frequency band and the third frequency band.

One end of the filter 51 is connected to the common terminal 100, and the other end of the filter 51 is connected to the input/output terminal 110. Also, one end of the high pass filter 56 is connected to the common terminal 100, and the other end of the high pass filter 56 is connected to one end of the low pass filter 54. The other end of the low pass filter 54 is connected to one end of the filter 52. The other end of the filter 52 is connected to one end of the low pass filter 55, and the other end of the low pass filter 55 is connected to one end of the high pass filter 57. The other end of the high pass filter 57 is connected to the input/output terminal 120. Also, one end of the filter 53 is connected to a connection node n1 between the other end of the low pass filter 54 and the one end of the filter 52, and the other end of the filter 53 is connected to the input/output terminal 130.

[2.4 Specific Structure of Multiplexer 5A According to Modification 3]

Figure 6B:
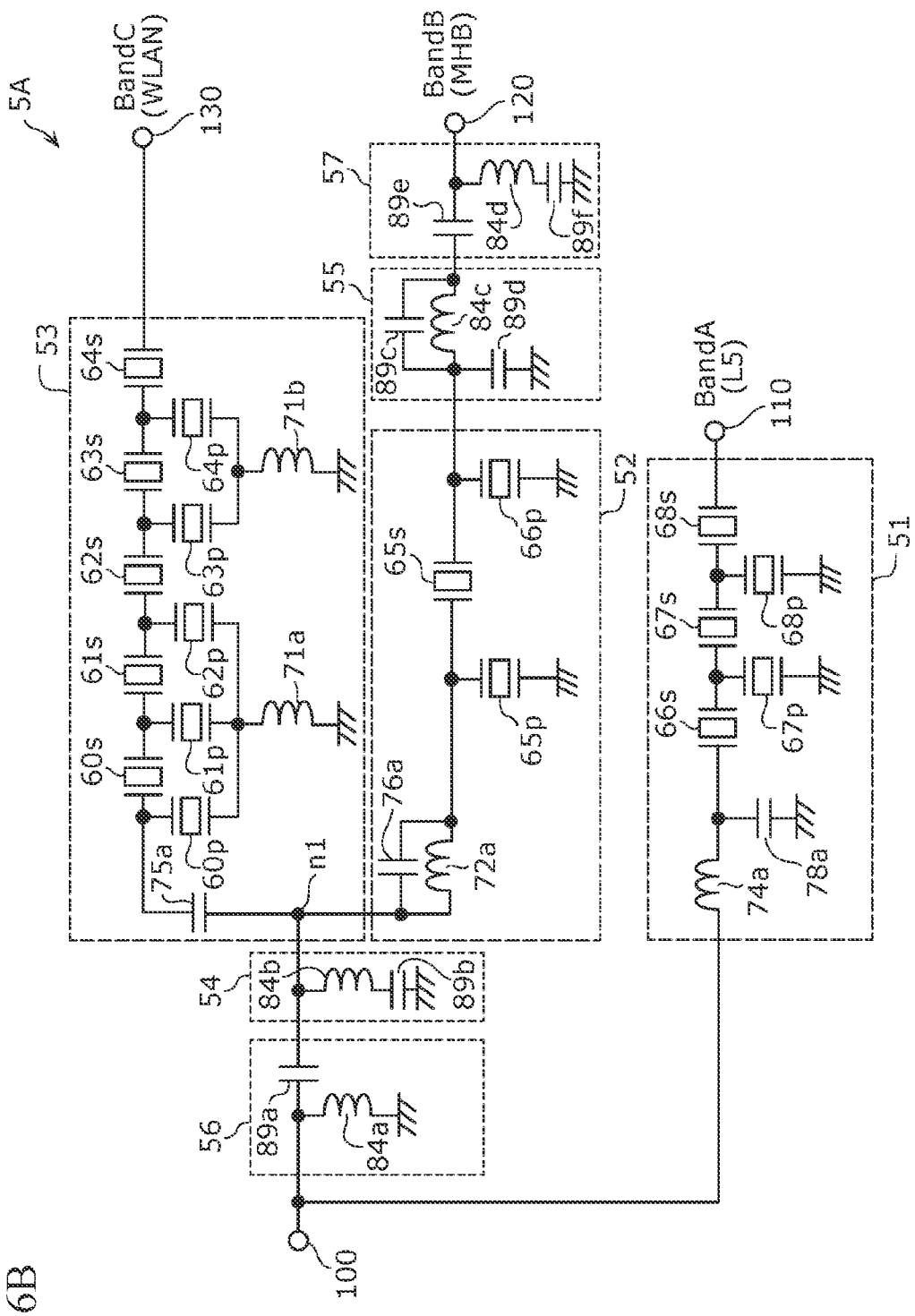
FIG. 6B is a circuit structure diagram of a multiplexer according to Modification 3.

FIG. 6B is a circuit structure diagram of a multiplexer 5A according to Modification 3. The multiplexer 5A according to Modification 3 discloses a specific circuit structure example of the multiplexer 5. The multiplexer 5A includes the common terminal 100, the input/output terminals 110, 120, and 130, the filters 51, 52, and 53, the low pass filters 54 and 55, and the high pass filters 56 and 57.

The filter 51 has series-arm resonators 66s, 67s, and 68s, parallel-arm resonators 67p and 68p, an inductor 74a, and a capacitor 78a. Each of the series-arm resonators 66s to 68s is an acoustic wave resonator arranged in series with a first signal path connecting the common terminal 100 and the input/output terminal 110. Each of the parallel-arm resonators 67p and 68p is an acoustic wave resonator connected between a node on the above-described first signal path and the ground. The inductor 74a is arranged in series between the common terminal 100 and the series-arm resonator 66s. The capacitor 78a is connected between a node on the first signal path and the ground. With the above-described structure, the filter 51 configures a ladder acoustic wave filter taking the first frequency band (communication band A) as a pass band.

The filter 52 has a circuit structure similar to that of the filter 42 according to Embodiment 2, and its description is therefore omitted. The filter 52 configures a ladder acoustic wave filter taking the third frequency band (communication band C) as an attenuation band.

The filter 53 has a circuit structure similar to that of the filter 43 according to Embodiment 2, and its description is therefore omitted. The filter 53 configures a ladder acoustic wave filter taking the third frequency band (communication band C) as a pass band.

The low pass filter 54 has an inductor 84b and a capacitor 89b. A series connection circuit of the inductor 84b and the capacitor 89b is connected between the ground and a node on a signal path connecting the common terminal 100 and the node n1. That is, the low pass filter 54 has a low pass function mainly by the capacitor 89b arranged on a parallel arm.

The high pass filter 56 has an inductor 84a and a capacitor 89a. The capacitor 89a is arranged in series on a signal path connecting the common terminal 100 and the node n1. The inductor 84a is connected between the ground and a node on the signal path connecting the common terminal 100 and the node n1. With the above-described structure, the high pass filter 56 has a high pass function.

The low pass filter 55 has an inductor 84c and capacitors 89c and 89d. A parallel connection circuit of the inductor 84c and the capacitor 89c is arranged in series with a second signal path connecting the filter 52 and the input/output terminal 120. The capacitor 89d is connected between a node on the second signal path and the ground. That is, the low pass filter 55 has a low pass function mainly by the inductor 84c arranged on a series arm and the capacitor 89d arranged on a parallel arm.

The high pass filter 57 has an inductor 84d and capacitors 89e and 89f. The capacitor 89e is arranged in series with a second signal path connecting the filter 52 and the input/output terminal 120. A series connection circuit of the inductor 84d and the capacitor 89f is connected between a node on the second signal path and the ground. That is, the high pass filter 57 has a high pass function mainly by the capacitor 89e arranged on a series arm and the inductor 84d arranged on a parallel arm.

In the multiplexer 5A according to the present example, the first frequency band (communication band A) is, for example, of L5 (1164.4 to 1187.95 MHz) of Global Navigation Satellite System (GNSS), the second frequency band (communication band B) is, for example, a middle-high band (1710 to 2370 MHz and 2496 to 2690 MHz), and the third frequency band (communication band C) is, for example, of a WLAN (2400 to 2483 MHz).

Figure 6C:
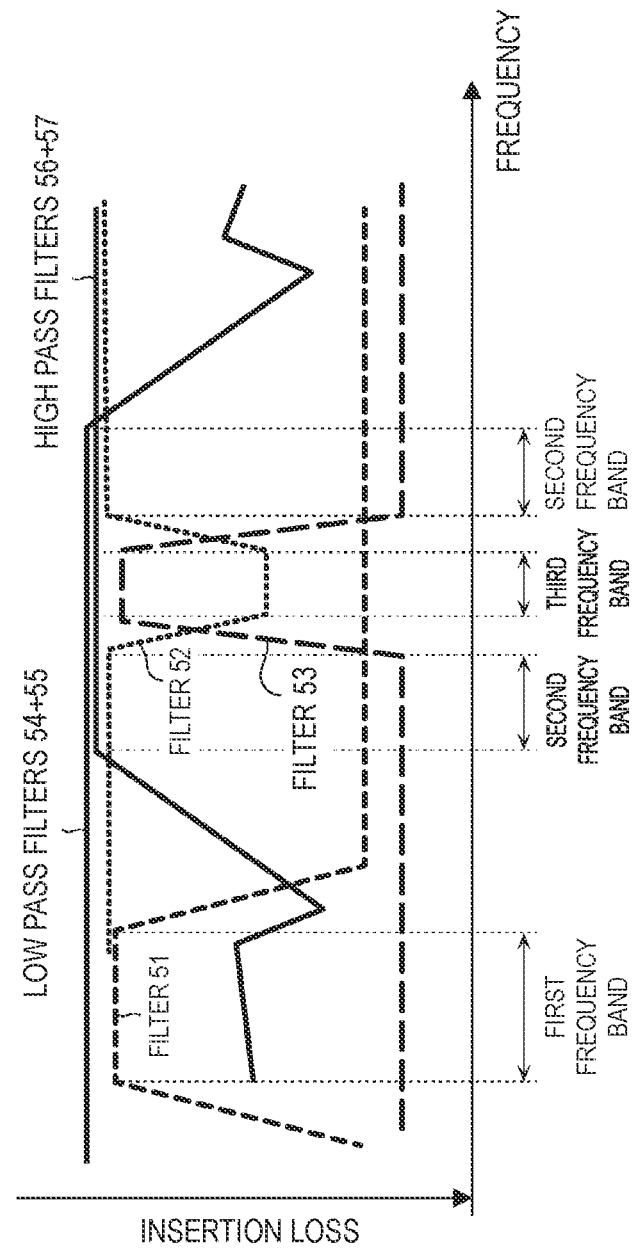
FIG. 6C is a diagram depicting a general outline of bandpass characteristics of each filter included in the multiplexer according to Modification 3.

FIG. 6C is a diagram depicting a general outline of bandpass characteristics of each filter included in the multiplexer 5A according to Modification 3. The filter 51 is a band-pass-type filter taking the first frequency band as a pass band, the filter 52 is a band elimination filter taking the third frequency band as an attenuation band, and the filter 53 is a band-pass-type filter taking the third frequency band as a pass band. As depicted in FIG. 6C, in the present modification, from a low-frequency side, (the pass band of) the filter 51, (part of the pass band of) the filter 52, (the pass band of) the filter 53, and (the other part of the pass band of) the filter 52 are present in this order. That is, from the low-frequency side, the first frequency band, part of the second frequency band, the third frequency band, and the other part of the second frequency band are positioned in this order. Also, as depicted in FIG. 6C, the bandpass characteristics of a circuit in which the low pass filter 54 and the low pass filter 55 are connected in series take the pass band of the filter 52 (second frequency band) and the pass band of the filter 53 (third frequency band) as pass bands. Also, the bandpass characteristics of a circuit connecting the high pass filter 56 and the high pass filter 57 in series take the pass band of the filter 52 (second frequency band) and the pass band of the filter 53 (third frequency band) as pass bands and the pass band of the filter 51 (first frequency band) as an attenuation band. Here, since the filter 52 is a band elimination filter taking the third frequency band as an attenuation band, the function of attenuating the first frequency band is low (attenuation in the first frequency band is small). Thus, the high pass filters 56 and 57 are required on the second signal path connecting the common terminal 100 and the input/output terminal 120. Also, since the filter 52 has a low function of attenuating a band on a high-frequency side with respect to the second frequency band and the third frequency band, the low pass filters 54 and 55 are required on the second signal path connecting the common terminal 100 and the input/output terminal 120. On the other hand, since the filter 53 is a band pass filter taking the third frequency band as a pass band, the function of attenuating the first frequency band is high (attenuation in the first frequency band is large) compared with the filter 52. Thus, when the high pass filters 56 and 57 are arranged on the third signal path connecting the common terminal 100 and the input/output terminal 130, the function of attenuating the first frequency band is excessive (overspec). Also, when the low pass filters 54 and 55 are arranged on the third signal path connecting the common terminal 100 and the input/output terminal 130, the function of attenuating a band on a high-frequency side with respect to the second frequency band and the third frequency band is excessive (overspec).

Figure 7:
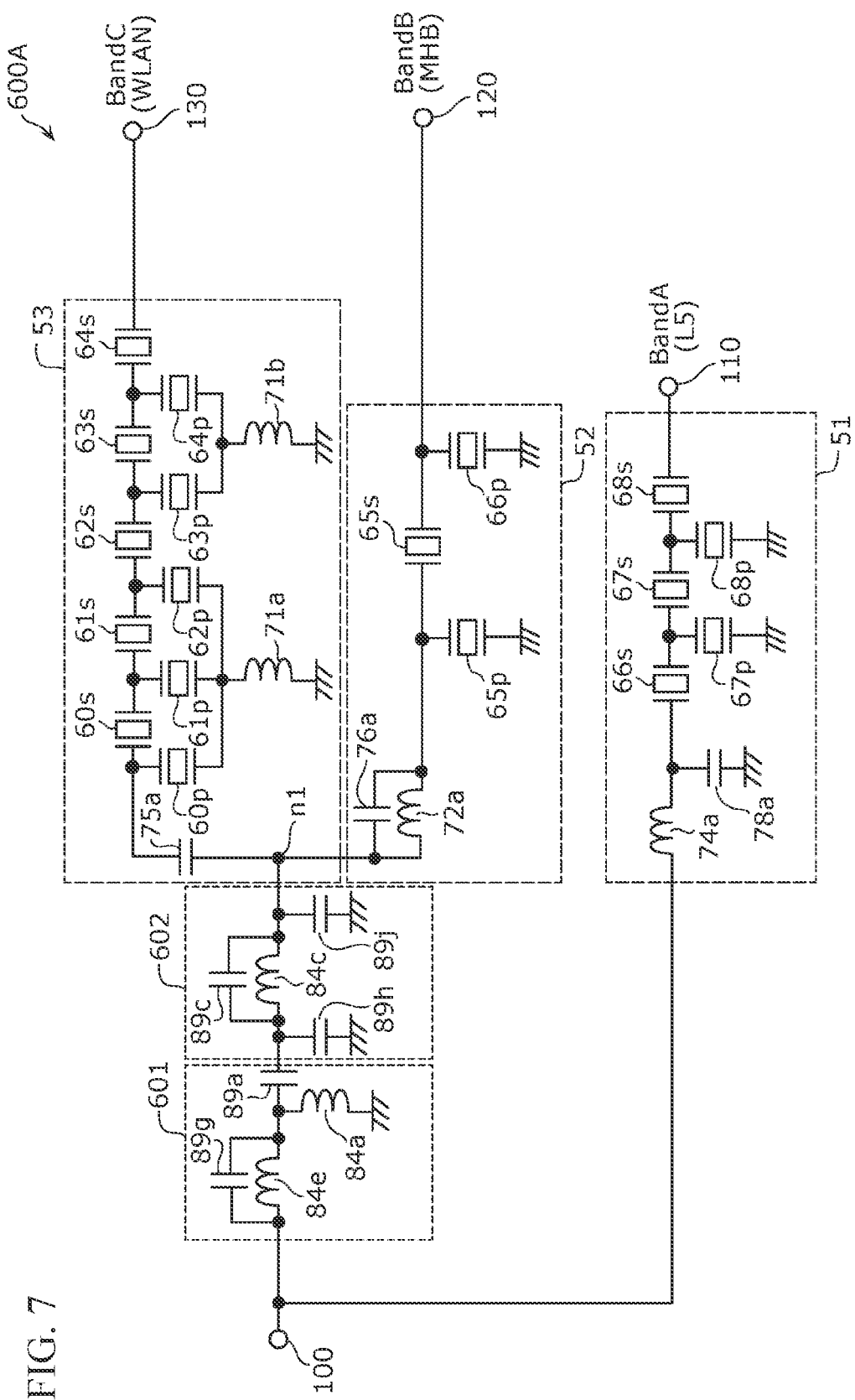
FIG. 7 is a circuit structure diagram of a multiplexer according to Comparative Example 2.

FIG. 7 is a circuit structure diagram of a multiplexer 600A according to Comparative Example 2. The multiplexer 600A depicted in the drawing includes the common terminal 100, the input/output terminals 110, 120, and 130, filters 51, 52, and 53, a high pass filter 601, and a low pass filter 602. The multiplexer 600A according to Comparative Example 2 is different compared with the multiplexer 5A according to Modification 3 in that the bandpass characteristics of the high pass filter 601 and the low pass filter 602 are different and also the low pass filter 55 and the high pass filter 57 are not arranged subsequently to the filter 52. As for the multiplexer 600A according to Comparative Example 2, description of the same points as those of the multiplexer 5A according to Modification 3 is omitted, and different points are mainly described below.

The high pass filter 601 has inductors 84a and 84e and capacitors 89a and 89g. A parallel connection circuit of the capacitor 89g and the inductor 84e is arranged in series on a signal path connecting the common terminal 100 and the node n1. The capacitor 89a is arranged in series on the signal path connecting the common terminal 100 and the node n1. The inductor 84a is connected between the ground and a node on the signal path connecting the common terminal 100 and the node n1. With the above-described structure, the high pass filter 601 has a high pass function.

The low pass filter 602 has an inductor 84c and capacitors 89c, 89h, and 89j. A parallel connection circuit of the inductor 84c and the capacitor 89c is arranged in series on the signal path connecting the common terminal 100 and the node n1. Each of the capacitors 89h and 89j is connected between the ground and a node on the signal path connecting the common terminal 100 and the node n1. With the above-described structure, the low pass filter 602 has a low pass function.

Note that the high pass filter 601 has bandpass characteristics equivalent to those of the series connection circuit of the high pass filters 56 and 57 included in the multiplexer 5A according to Modification 3. That is, attenuation in the first frequency band of the high pass filter 601 is larger than attenuation in the first frequency band in the high pass filter 56 and is larger than attenuation in the first frequency band of the high pass filter 57. Meanwhile, insertion loss in the second frequency band and the third frequency band of the high pass filter 601 is larger than insertion loss in the second frequency band and the third frequency band of the high pass filter 56 and is larger than insertion loss in the second frequency band and the third frequency band of the high pass filter 57.

Also, the low pass filter 602 has bandpass characteristics equivalent to those of the series connection circuit of the low pass filters 54 and 55 included in the multiplexer 5A according to Modification 3. That is, insertion loss in the second frequency band and the third frequency band of the low pass filter 602 is larger than insertion loss in the second frequency band and the third frequency band of the low pass filter 54 and is larger than insertion loss in the second frequency band and the third frequency band of the low pass filter 55.

According to the above-described structure of the multiplexer 600A of Comparative Example 2, isolation between the filter 51 and the filters 52 and 53 can be ensured by the high pass filter 601. Here, as depicted in FIG. 6C, since the filter 52 has a low function of attenuating the first frequency band (attenuation in the first frequency band is small), the high pass filter 601 is required on a second signal path connecting the common terminal 100 and the input/output terminal 120. On the other hand, as depicted in FIG. 6C, the filter 53 has a high function of attenuating the first frequency band (attenuation in the first frequency band is large) compared with the filter 52. Thus, when the high pass filter 601 is arranged on a third signal path connecting the common terminal 100 and the input/output terminal 130, the function of attenuating the first frequency band is excessive (overspec). Accordingly, since the high pass filter 601 is arranged on the third signal path, transmission loss in the third signal path is degraded. That is, a difference in attenuation required for the first frequency band occurs between two filters 52 and 53 commonly connected to the high pass filter 601, thereby posing a problem of degradation in transmission loss of the third signal path where the filter 53 is arranged.

By contrast, according to the structure of the multiplexer 5A of the present modification, the low pass filter 54 and the high pass filter 56 are connected between the filters 52 and 53 and the common terminal 100, and the low pass filter 55 and the high pass filter 57 are connected to the other end of the filter 52. That is, the filter function of allowing passage through the second frequency band and the third frequency band and attenuating the first frequency band is arranged prior to the filters 52 and 53 (between the common terminal 100 and the filters 52 and 53) and subsequently to the filter 52 (between the filter 52 and the input/output terminal 120) in a divided manner. Here, the high pass filter 56 has a function of shifting impedance in the first frequency band when the filter 52 is viewed from the common terminal 100 and impedance in the first frequency band when the filter 53 is viewed from the common terminal 100 to an open side. In other words, the high pass filter 56 has a function of increasing a reflection coefficient in the first frequency band of the second signal path and the third signal path. Also, the high pass filter 56 has a function of increasing attenuation in the first frequency band of the second signal path and the third signal path. Meanwhile, the high pass filter 57 has a function of increasing a reflection coefficient in the first frequency band of the second signal path and the third signal path. Also, the high pass filter 57 has a function of increasing attenuation in the first frequency band of the second signal path. Furthermore, the high pass filter 57 also has the function of an impedance matching circuit arranged subsequently to the filter 52. Note that as for the effect of increasing the reflection coefficient in the first frequency band when the filters 52 and 53 are viewed from the common terminal 100, the effect of the high pass filter 57 is lower than that of the high pass filter 56. This is due to the fact that a high pass filter connected nearer to the common terminal 100 has a higher degree of contribution to the effect of increasing the reflection coefficient in the first frequency band.

On the other hand, the low pass filters 54 and 55 have a function of increasing attenuation on a high-frequency side with respect to the first frequency band, the second frequency band, and the third frequency band on the second signal path and the third signal path.

That is, since the high pass filter 56 is arranged prior to the filters 52 and 53, isolation between the filter 51 and the filters 52 and 53 can be sufficiently ensured.

Figure 8:
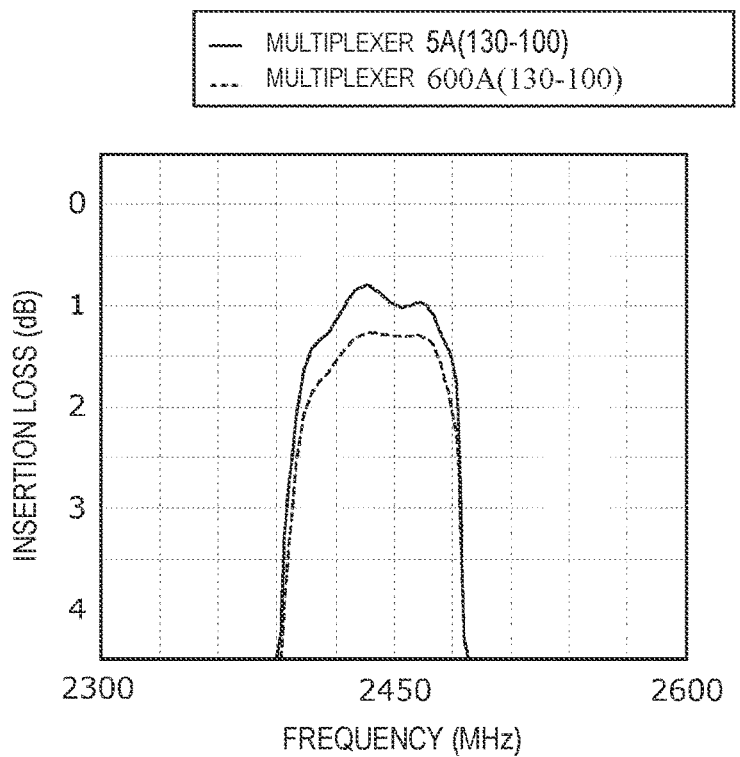
FIG. 8 is a graph in which bandpass characteristics of a third signal path according to Modification 3 and those according to Comparative Example 2 are compared.

FIG. 8 is a graph in which bandpass characteristics of the third signal path according to Modification 3 and those according to Comparative Example 2 are compared. In the drawing, bandpass characteristics of the third signal path (the common terminal 100 to the input/output terminal 130) in the multiplexer 5A according to Modification 3 and bandpass characteristics of the third signal path (the common terminal 100 to the input/output terminal 130) in the multiplexer 600A according to Comparative Example 2 are depicted. As depicted in the drawing, it can be found that insertion loss in the third frequency band (2400 to 2483 MHz) of the multiplexer 5A according to Modification 3 is smaller than insertion loss in the third frequency band (2400 to 2483 MHz) of the multiplexer 600A according to Comparative Example 2. This is due to the fact that, in the multiplexer 5A according to Modification 3, compared with the multiplexer 600A according to Comparative Example 2, transmission loss of the third signal path can be reduced by insertion loss of the high pass filter 57 and the low pass filter 55. That is, while isolation between the filter 51 and the filters 52 and 53 and attenuation in the first frequency band of the second signal path and the third signal path is sufficiently ensured, transmission loss of the third signal path can be reduced. Furthermore, since the low pass filter 55 and the high pass filter 57 are arranged subsequently to the filter 52, circuit elements configuring the low pass filter 55 and the high pass filter 57 can be used also as impedance matching elements between the filter 52 and circuit elements connected subsequently to the filter 52. That is, in the multiplexer 5A according to Modification 3, it is not required to separately arrange an impedance matching circuit subsequently to the filter 52. Thus, while transmission loss of the multiplexer 5A is reduced, the number of circuit elements can be reduced, and downsizing can be achieved.

Note that in each of the multiplexer 2 according to Modification 1, the multiplexer 3 according to Modification 2, and the multiplexer 5 according to Modification 3, the first frequency band (communication band A) is, for example, a low band (617 to 960 MHz), the second frequency band (communication band B) is, for example, a low-middle band (1427.9 to 1510.9 MHz) and a middle-high band (1710 to 2690 MHz), and the second frequency band (communication band B) is, for example, of L1 (1559.072 to 1605.92 MHz) of GNSS.

[2.5 Specific Structure of Multiplexer 6 According to Modification 4]

Figure 9:
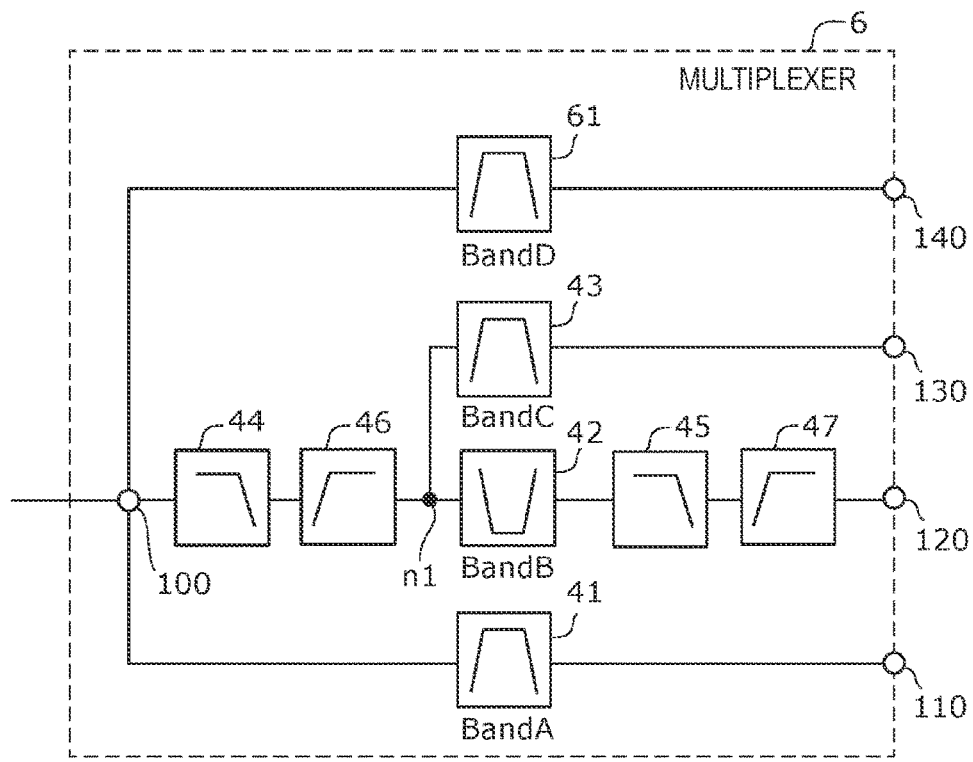
FIG. 9 is a circuit block diagram of a multiplexer according to Modification 4.

FIG. 9 is a circuit block diagram of a multiplexer 6 according to Modification 4. The multiplexer 6 includes the common terminal 100, the input/output terminals 110, 120, 130, and 140, filters 41, 42, 43, and 61, the low pass filters 44 and 45, and the high pass filters 46 and 47. The multiplexer 6 according to Modification 4 is different compared with the multiplexer 4 according to Embodiment 2 in that the filter 61 is added. As for the multiplexer 6 according to the present modification, description of the same points as those of the multiplexer 4 according to Embodiment 2 is omitted, and different points are mainly described below.

The filter 61 is one example of a tenth filter, and is a filter taking a fourth frequency band as a pass band.

The low pass filter 44 is one example of a sixth filter, and is a low-pass-type filter taking the second frequency band, the third frequency band, and the fourth frequency band as pass bands and the first frequency band as an attenuation band.

The high pass filter 46 is one example of a seventh filter, and is a high-pass-type filter taking the first frequency band, the second frequency band, and the third frequency band as pass bands and the fourth frequency band as an attenuation band.

The low pass filter 45 is one example of an eighth filter, and is a low-pass-type filter taking the second frequency band, the third frequency band, and the fourth frequency band as pass bands and the first frequency band as an attenuation band.

The high pass filter 47 is one example of a ninth filter, and is a high-pass-type filter taking the first frequency band, the second frequency band, and the third frequency band as pass bands and the fourth frequency band as an attenuation band.

Here, the second frequency band and the third frequency band are at least partially different in frequency. Also, the first frequency band does not overlap, in frequency, the second frequency band and the third frequency band, and is positioned on a high-frequency side with respect to the second frequency band and the third frequency band. Also, the fourth frequency band does not overlap, in frequency, the second frequency band and the third frequency band, and is positioned on a low-frequency side with respect to the second frequency band and the third frequency band.

One end of the filter 61 is connected to the common terminal 100, and the other end of the filter 61 is connected to the input/output terminal 140 (fourth input/output terminal).

According to the structure of the multiplexer 6 of the present modification, the low pass filters 44 and 45 which allow passage through the second frequency band and the third frequency band and attenuate the first frequency band are arranged prior to the filters 42 and 43 (between the common terminal 100 and the filters 42 and 43) and subsequently to the filter 42 (between the filter 42 and the input/output terminal 120) in a divided manner. Here, the low pass filter 44 has a function of shifting impedance in the first frequency band when the filter 42 is viewed from the common terminal 100 and impedance in the first frequency band when the filter 43 is viewed from the common terminal 100 to an open side. Also, the low pass filter 44 has a function of increasing attenuation in the first frequency band of the second signal path and the third signal path. Meanwhile, the low pass filter 45 has a function of increasing a reflection coefficient in the first frequency band of the second signal path and the third signal path. Also, the low pass filter 45 has a function of increasing attenuation in the first frequency band of the second signal path. Furthermore, the low pass filter 45 also has the function of an impedance matching circuit arranged subsequently to the filter 42.

Further, according to the structure of the multiplexer 6 of the present modification, the high pass filters 46 and 47 which allow passage through the second frequency band and the third frequency band and attenuate the fourth frequency band are arranged prior to the filters 42 and 43 (between the common terminal 100 and the filters 42 and 43) and subsequently to the filter 42 (between the filter 42 and the input/output terminal 120) in a divided manner. Here, the high pass filter 46 has a function of shifting impedance in the fourth frequency band when the filter 42 is viewed from the common terminal 100 and impedance in the fourth frequency band when the filter 43 is viewed from the common terminal 100 to an open side. Also, the high pass filter 46 has a function of increasing attenuation in the fourth frequency band of the second signal path and the third signal path. Meanwhile, the high pass filter 47 has a function of increasing a reflection coefficient in the fourth frequency band of the second signal path and the third signal path. Also, the high pass filter 47 has a function of increasing attenuation in the fourth frequency band of the second signal path. Furthermore, the high pass filter 47 also has the function of an impedance matching circuit arranged subsequently to the filter 42.

That is, since the low pass filter 44 is arranged prior to the filters 42 and 43, isolation between the filter 41 and the filters 42 and 43 can be sufficiently ensured. Since the high pass filter 46 is arranged prior to the filters 42 and 43, isolation between the filter 61 and the filters 42 and 43 can be sufficiently ensured. Also, on the third signal path connecting the common terminal 100 and the input/output terminal 130, the low pass filter 44 is arranged, but the low pass filter 45 is not arranged. Thus, compared with the multiplexer in which the filter circuit in which the low pass filters 44 and 45 are connected in series is arranged prior to the filters 42 and 43, transmission loss of the third signal path can be reduced by insertion loss of the low pass filter 45. Also, on the third signal path connecting the common terminal 100 and the input/output terminal 130, the high pass filter 46 is arranged, but the high pass filter 47 is not arranged. Thus, compared with the multiplexer in which the filter circuit in which the high pass filters 46 and 47 are connected in series is arranged prior to the filters 42 and 43, transmission loss of the third signal path can be reduced by insertion loss of the high pass filter 47. That is, while isolation between the filter 41 and the filters 42 and 43 and isolation between the filter 61 and the filters 42 and 43 are ensured and attenuation in the first frequency band and the fourth frequency band of the second signal path and the third signal path is sufficiently ensured, transmission loss of the third signal path can be reduced. Furthermore, since the low pass filter 45 and the high pass filter 47 are arranged subsequently to the filter 42, circuit elements configuring the low pass filter 45 and the high pass filter 47 can be used also as impedance matching elements between the filter 42 and circuit elements connected subsequently to the filter 42. That is, in the multiplexer 6 according to Modification 4, it is not required to separately arrange an impedance matching circuit subsequently to the filter 42. Thus, while transmission loss of the multiplexer 6 is reduced, the number of circuit elements can be reduced, and downsizing can be achieved.

Embodiment 3

In Embodiments 1 and 2, the multiplexer is described which includes the first filter taking the first frequency band (communication band A) as a pass band, the second filter taking the second frequency band (communication band B) as a pass band and the third frequency band (communication band C) as an attenuation band, and the third filter taking the third frequency band as a pass band and the first frequency band and the second frequency band as attenuation bands. By contrast, in the present embodiment, a multiplexer is described which includes a second filter taking the second frequency band (communication band B) as a pass band and the third frequency band (communication band C) as an attenuation band and a third filter taking the third frequency band as a pass band and the second frequency band as an attenuation band and which does not include a first filter taking the first frequency band as a pass band.

[3.1 Structure of Multiplexer 7]

Figure 10:
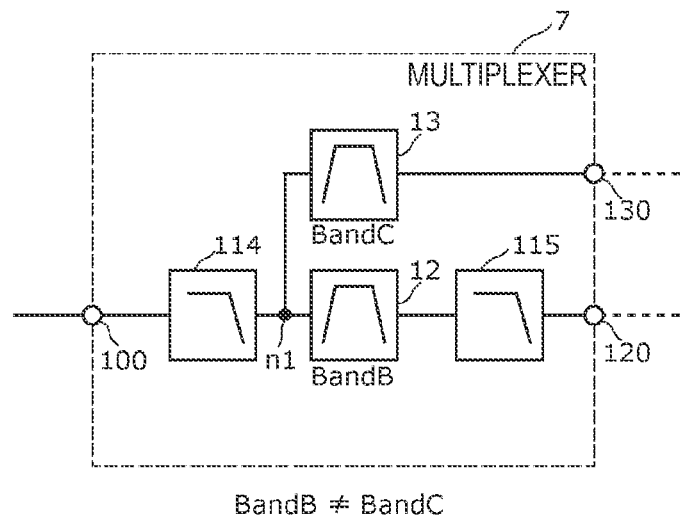
FIG. 10 is a circuit block diagram of a multiplexer according to Embodiment 3.

FIG. 10 is a circuit block diagram of a multiplexer 7 according to Embodiment 3. As depicted in the drawing, the multiplexer 7 includes the common terminal 100, the input/output terminals 120 and 130, the filters 12 and 13, and low pass filters 114 and 115. The multiplexer 7 according to Embodiment 3 is different compared with the multiplexer 1 according to Embodiment 1 in that the filter 11 is not included. As for the multiplexer 7 according to the present embodiment, description of the same points as those of the multiplexer 1 according to Embodiment 1 is omitted, and different points are mainly described below.

The filter 12 is one example of a second filter, and is a filter taking a second frequency band as a pass band and a third frequency band as an attenuation band. The filter 13 is one example of a third filter, and is a filter taking the third frequency band as a pass band and the second frequency band as an attenuation band.

Note that the second frequency band is, for example, a frequency band including a communication band B, and the third frequency band is, for example, a frequency band including a communication band C.

The low pass filter 114 is one example of a fourth filter, and is a low-pass-type filter taking the second frequency band and the third frequency band as pass bands and a band on a high-frequency side with respect to the second frequency band and the third frequency band as an attenuation band. The low pass filter 114 takes, in particular, a harmonic band of a signal in the second frequency band and a harmonic band of a signal in the third frequency band as attenuation bands.

The low pass filter 115 is one example of a fifth filter, and is a low-pass-type filter taking the second frequency band and the third frequency band as pass bands and a band on a high-frequency side with respect to the second frequency band and the third frequency band as an attenuation band. Also, the low pass filter 115 has a function of impedance matching with an external circuit connected to the input/output terminal 120.

Here, the second frequency band and the third frequency band are at least partially different in frequency.

One end of the low pass filter 114 is connected to the common terminal 100, and the other end of the low pass filter 114 is connected to one end of the filter 12. The other end of the filter 12 is connected to one end of the low pass filter 115, and the other end of the low pass filter 115 is connected to the input/output terminal 120. Also, one end of the filter 13 is connected to a connection node n1 between the other end of the low pass filter 114 and the one end of the filter 12, and the other end of the filter 13 is connected to the input/output terminal 130.

Figure 11:
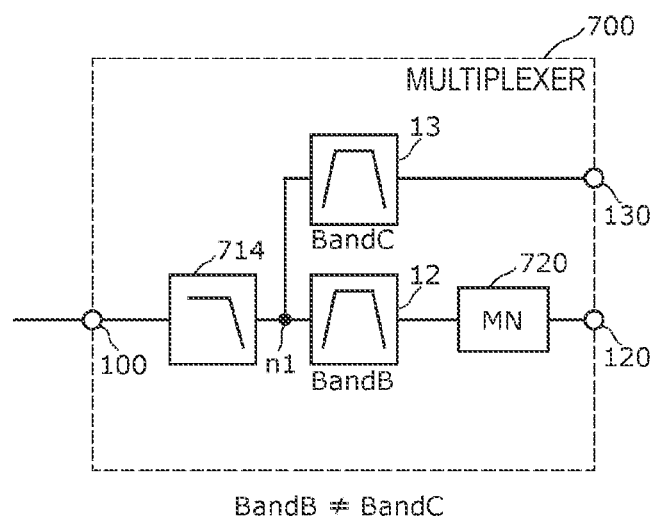
FIG. 11 is a circuit block diagram of a multiplexer according to Comparative Example 3.

FIG. 11 is a circuit block diagram of a multiplexer 700 according to Comparative Example 3. The multiplexer 700 depicted in FIG. 11 includes the common terminal 100, the input/output terminals 120 and 130, the filters 12 and 13, a low pass filter 714, and an impedance matching circuit 720. The multiplexer 700 according to Comparative Example 3 is different compared with the multiplexer 7 according to Embodiment 3 in that the bandpass characteristics of the low pass filter 714 are different and also the low pass filter 115 is not arranged subsequently to the filter 12 and the impedance matching circuit 720 is arranged instead. As for the multiplexer 700 according to Comparative Example 3, description of the same points as those of the multiplexer 7 according to Embodiment 3 is omitted, and different points are mainly described below.

The low pass filter 714 is a low-pass-type filter taking the second frequency band and the third frequency band as pass bands and a band on a high-frequency side with respect to the second frequency band and the third frequency band as an attenuation band. Note that attenuation in the band on the high-frequency side with respect to the second frequency band and the third frequency band of the low pass filter 714 is larger than attenuation in the band on the high-frequency side with respect to the second frequency band and the third frequency band of the low pass filter 114, and is larger than attenuation in the band on the high-frequency side with respect to the second frequency band and the third frequency band of the low pass filter 115. Meanwhile, insertion loss in the second frequency band and the third frequency band of the low pass filter 714 is larger than insertion loss in the second frequency band and the third frequency band of the low pass filter 114, and is larger than insertion loss in the second frequency band and the third frequency band of the low pass filter 115.

One end of the low pass filter 714 is connected to the common terminal 100, and the other end of the low pass filter 714 is connected to one end of the filter 12. The other end of the filter 12 is connected to one end of the impedance matching circuit 720, and the other end of the impedance matching circuit 720 is connected to the input/output terminal 120. Also, one end of the filter 13 is connected to the connection node n1 between the other end of the low pass filter 714 and the one end of the filter 12, and the other end of the filter 13 is connected to the input/output terminal 130.

According to the above-described structure of the multiplexer 700 of Comparative Example 3, by the low pass filter 714, it is possible to suppress a harmonic wave of a signal in the second frequency band and a harmonic wave of a signal in the third frequency band. Here, since the filter 12 has a low function of attenuating a band on the high-frequency side with respect to the second frequency band and the third frequency band, the low pass filter 714 is required on a second signal path connecting the common terminal 100 and the input/output terminal 120. On the other hand, the filter 13 has a high function of attenuating the band on the high-frequency side with respect to the second frequency band and the third frequency band compared with the filter 12. Thus, when the low pass filter 714 is arranged on a third signal path connecting the common terminal 100 and the input/output terminal 130, the function of attenuating the band on the high-frequency side with respect to the second frequency band and the third frequency band is excessive (overspec). Accordingly, since the low pass filter 714 is arranged on the third signal path, transmission loss in the third signal path is degraded. That is, a difference in attenuation required for the band on the high-frequency side with respect to the second frequency band and the third frequency band occurs between two filters 12 and 13 commonly connected to the low pass filter 714, thereby posing a problem of degradation in transmission loss of the third signal path where the filter 13 is arranged.

By contrast, according to the structure of the multiplexer 7 of Embodiment 3, the low pass filter 114 is connected between the filters 12 and 13 and the common terminal 100, and the low pass filter 115 is connected to the other end of the filter 12. That is, the filter function of allowing passage through the second frequency band and the third frequency band and attenuating the band on the high-frequency side with respect to the second frequency band and the third frequency band is arranged prior to the filters 12 and 13 (between the common terminal 100 and the filters 12 and 13) and subsequently to the filter 12 (between the filter 12 and the input/output terminal 120) in a divided manner. The low pass filter 114 has a function of increasing attenuation in the band on the high-frequency side with respect to the second frequency band and the third frequency band of the second signal path and the third signal path. Also, the low pass filter 115 has a function of increasing attenuation in the band on the high-frequency side with respect to the second frequency band and the third frequency band of the second signal path. Furthermore, the low pass filter 115 also has the function of an impedance matching circuit arranged subsequently to the filter 12.

Since the low pass filter 114 is arranged prior to the filters 12 and 13, it is possible to suppress output of a harmonic wave of a signal in the second frequency band and a harmonic wave of a signal in the third frequency band. Also, on the third signal path connecting the common terminal 100 and the input/output terminal 130, the low pass filter 114 is arranged, but the low pass filter 115 is not arranged. Thus, compared with the multiplexer 700 in which the low pass filter 714 is arranged prior to the filters 12 and 13, transmission loss of the third signal path can be reduced by insertion loss of the low pass filter 115. That is, while output of a harmonic wave of a signal in the second frequency band and a harmonic wave of a signal in the third frequency band is suppressed and attenuation in the band on the high-frequency side with respect to the second frequency band and the third frequency band of the second signal path and the third signal path is sufficiently ensured, transmission loss of the third signal path can be reduced. Furthermore, since the low pass filter 115 is arranged subsequently to the filter 12, circuit elements configuring the low pass filter 115 can be used also as impedance matching elements between the filter 12 and circuit elements connected subsequently to the filter 12. That is, in the multiplexer 7 according to Embodiment 3, the impedance matching circuit 720 arranged in the multiplexer 700 according to Comparative Example 3 is not required. Thus, while transmission loss of the multiplexer 7 is reduced, the number of circuit elements can be reduced, and downsizing can be achieved.

[3.2 Circuit Structure of Multiplexer 8 According to Modification 5]

Figure 12:
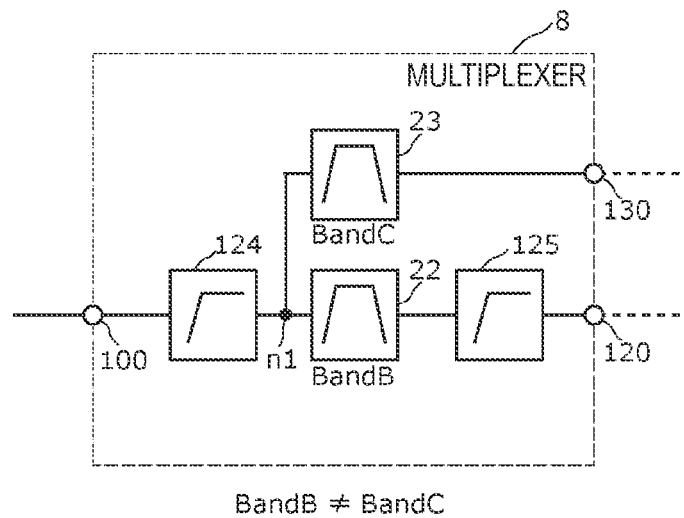
FIG. 12 is a circuit block diagram of a multiplexer according to Modification 5.

FIG. 12 is a circuit block diagram of a multiplexer 8 according to Modification 5. The multiplexer 8 includes the common terminal 100, the input/output terminals 120 and 130, the filters 22 and 23, and high pass filters 124 and 125. The multiplexer 8 according to Modification 5 is different compared with the multiplexer 7 according to Embodiment 3 in that high pass filters are arranged in place of low pass filters. As for the multiplexer 8 according to Modification 5, description of the same points as those of the multiplexer 7 according to Embodiment 3 is omitted, and different points are mainly described below.

The filter 22 is one example of a second filter, and is a filter taking a second frequency band as a pass band and a third frequency band as an attenuation band. The filter 23 is one example of a third filter, and is a filter taking the third frequency band as a pass band and the second frequency band as an attenuation band.

The high pass filter 124 is one example of a fourth filter, and is a high-pass-type filter taking the second frequency band and the third frequency band as pass bands and a band on a low-frequency side with respect to the second frequency band and the third frequency band as an attenuation band.

The high pass filter 125 is one example of a fifth filter, and is a high-pass-type filter taking the second frequency band and the third frequency band as pass bands and a band on a low-frequency side with respect to the second frequency band and the third frequency band as an attenuation band. Also, the high pass filter 125 has a function of impedance matching with an external circuit connected to the input/output terminal 120.

Here, the second frequency band and the third frequency band are at least partially different in frequency.

One end of the high pass filter 124 is connected to the common terminal 100, and the other end of the high pass filter 124 is connected to one end of the filter 22. The other end of the filter 22 is connected to one end of the high pass filter 125, and the other end of the high pass filter 125 is connected to the input/output terminal 120. Also, one end of the filter 23 is connected to a connection node n1 between the other end of the high pass filter 124 and the one end of the filter 22, and the other end of the filter 23 is connected to the input/output terminal 130.

According to the structure of the multiplexer 8 of the present modification, the high pass filter 124 is connected between the filters 22 and 23 and the common terminal 100, and the high pass filter 125 is connected to the other end of the filter 22. That is, the filter function of allowing passage through the second frequency band and the third frequency band and attenuating the band on the low-frequency side with respect to the second frequency band and the third frequency band is arranged prior to the filters 22 and 23 (between the common terminal 100 and the filters 22 and 23) and subsequently to the filter 22 (between the filter 22 and the input/output terminal 120) in a divided manner. The high pass filter 124 has a function of increasing attenuation in the band on the low-frequency side with respect to the second frequency band and the third frequency band of the second signal path and the third signal path. Also, the high pass filter 125 has a function of increasing attenuation in the band on the low-frequency side with respect to the second frequency band and the third frequency band of the second signal path. Furthermore, the high pass filter 125 also has the function of an impedance matching circuit arranged subsequently to the filter 22.

That is, on the third signal path connecting the common terminal 100 and the input/output terminal 130, the high pass filter 124 is arranged, but the high pass filter 125 is not arranged. Thus, transmission loss of the third signal path can be reduced by insertion loss of the high pass filter 125. That is, while attenuation in the band on the low-frequency side with respect to the second frequency band and the third frequency band of the second signal path and the third signal path is sufficiently ensured, transmission loss of the third signal path can be reduced. Furthermore, since the high pass filter 125 is arranged subsequently to the filter 22, circuit elements configuring the high pass filter 125 can be used also as impedance matching elements between the filter 22 and circuit elements connected subsequently to the filter 22. That is, in the multiplexer 8 according to the present modification, an impedance matching circuit is not required separately. Thus, while transmission loss of the multiplexer 8 is reduced, the number of circuit elements can be reduced, and downsizing can be achieved.

[3.3 Circuit Structure of Multiplexer 9 According to Modification 6]

Figure 13:
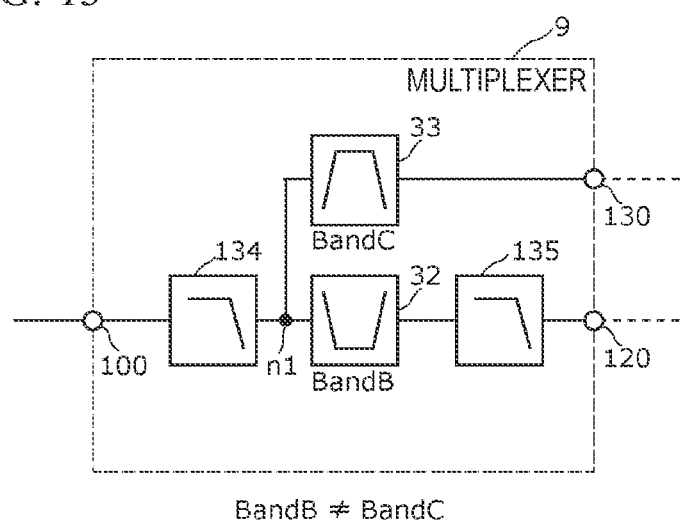
FIG. 13 is a circuit block diagram of a multiplexer according to Modification 6.

FIG. 13 is a circuit block diagram of a multiplexer 9 according to Modification 6. The multiplexer 9 includes the common terminal 100, the input/output terminals 120 and 130, the filters 32 and 33, and low pass filters 134 and 135. The multiplexer 9 according to Modification 6 is different compared with the multiplexer 7 according to Embodiment 3 in that the filter 32 is not a band pass filter but a band elimination filter. As for the multiplexer 9 according to Modification 6, description of the same points as those of the multiplexer 7 according to Embodiment 3 is omitted, and different points are mainly described below.

The filter 32 is one example of a second filter, and is a band elimination filter taking the third frequency band as an attenuation band. The filter 33 is one example of a third filter, and is a filter taking the third frequency band as a pass band and the second frequency band as an attenuation band. The filter 32 and the filter 33 each takes the third frequency band as an attenuation band and a pass band, configuring an extractor.

The low pass filter 134 is one example of a fourth filter, and is a low-pass-type filter taking the second frequency band and the third frequency band as pass bands and a band on a high-frequency side with respect to the second frequency band and the third frequency band as an attenuation band. The low pass filter 134 takes, in particular, a harmonic band of a signal in the second frequency band and a harmonic band of a signal in the third frequency band as attenuation bands.

The low pass filter 135 is one example of a fifth filter, and is a low-pass-type filter taking the second frequency band and the third frequency band as pass bands and a band on a high-frequency side with respect to the second frequency band and the third frequency band as an attenuation band. Also, the low pass filter 135 has a function of impedance matching with an external circuit connected to the input/output terminal 120.

Here, the second frequency band and the third frequency band are at least partially different in frequency.

One end of the low pass filter 134 is connected to the common terminal 100, and the other end of the low pass filter 134 is connected to one end of the filter 32. The other end of the filter 32 is connected to one end of the low pass filter 135, and the other end of the low pass filter 135 is connected to the input/output terminal 120. Also, one end of the filter 33 is connected to a connection node n1 between the other end of the low pass filter 134 and the one end of the filter 32, and the other end of the filter 33 is connected to the input/output terminal 130.

According to the structure of the multiplexer 9 of the present modification, the low pass filter 134 is connected between the filters 32 and 33 and the common terminal 100, and the low pass filter 135 is connected to the other end of the filter 32. That is, the filter function of allowing passage through the second frequency band and the third frequency band and attenuating the band on the high-frequency side with respect to the second frequency band and the third frequency band is arranged prior to the filters 32 and 33 (between the common terminal 100 and the filters 32 and 33) and subsequently to the filter 32 (between the filter 32 and the input/output terminal 120) in a divided manner. The low pass filter 134 has a function of increasing attenuation in the band on the high-frequency side with respect to the second frequency band and the third frequency band of the second signal path and the third signal path. Also, the low pass filter 135 has a function of increasing attenuation in the band on the high-frequency side with respect to the second frequency band and the third frequency band of the second signal path. Furthermore, the low pass filter 135 also has the function of an impedance matching circuit arranged subsequently to the filter 32.

Since the low pass filter 134 is arranged prior to the filters 32 and 33, it is possible to suppress output of a harmonic wave of a signal in the second frequency band and a harmonic wave of a signal in the third frequency band. Also, on the third signal path connecting the common terminal 100 and the input/output terminal 130, the low pass filter 134 is arranged, but the low pass filter 135 is not arranged. Thus, compared with the multiplexer in which the filter circuit in which the low pass filters 134 and 135 are connected in series is arranged prior to the filters 32 and 33, transmission loss of the third signal path can be reduced by insertion loss of the low pass filter 135. That is, while output of a harmonic wave of a signal in the second frequency band and a harmonic wave of a signal in the third frequency band is suppressed and attenuation in the band on the high-frequency side with respect to the second frequency band and the third frequency band of the second signal path and the third signal path is sufficiently ensured, transmission loss of the third signal path can be reduced. Furthermore, since the low pass filter 135 is arranged subsequently to the filter 32, circuit elements configuring the low pass filter 135 can be used also as impedance matching elements between the filter 32 and circuit elements connected subsequently to the filter 32. That is, in the multiplexer 9 according to the present modification, an impedance matching circuit is not required separately. Thus, while transmission loss of the multiplexer 9 is reduced, the number of circuit elements can be reduced, and downsizing can be achieved.

[3.4 Circuit Structure of Multiplexer 10 According to Modification 7]

Note that as a modification of the multiplexer 9 according to Modification 6, a multiplexer is also included in the present disclosure in which, in comparison with the multiplexer 9 according to Modification 6, a frequency relation between the second frequency band and the third frequency band is different and high pass filters are arranged in place of low pass filters.

Figure 14:
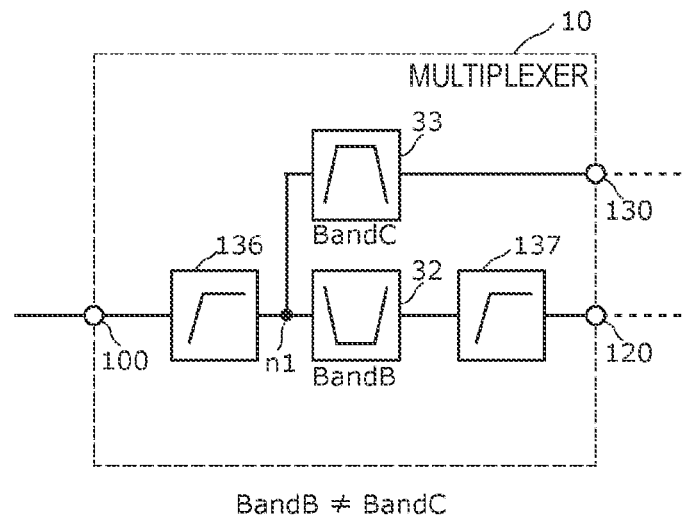
FIG. 14 is a circuit block diagram of a multiplexer according to Modification 7.

FIG. 14 is a circuit block diagram of a multiplexer 10 according to Modification 7. The multiplexer 10 according to Modification 7 includes the common terminal 100, the input/output terminals 120 and 130, the filters 32 and 33, and high pass filters 136 and 137. The second frequency band and the third frequency band are at least partially different in frequency.

The high pass filter 136 is one example of a fourth filter, and is a high-pass-type filter taking the second frequency band and the third frequency band as pass bands and a band on a low-frequency side with respect to the second frequency band and the third frequency band as an attenuation band.

The high pass filter 137 is one example of a fifth filter, and is a high-pass-type filter taking the second frequency band and the third frequency band as pass bands and a band on a low-frequency side with respect to the second frequency band and the third frequency band as an attenuation band. Also, the high pass filter 137 has a function of impedance matching with an external circuit connected to the input/output terminal 120.

With this, transmission loss of the third signal path can be reduced by insertion loss of the high pass filter 137 subsequently arranged, and circuit elements configuring the high pass filter 137 subsequently arranged can be used also as impedance matching elements connected subsequently to the filter 32. Thus, while transmission loss of the multiplexer 10 is reduced, the number of circuit elements can be reduced, and downsizing can be achieved.

[3.5 Circuit Structure of Multiplexer 20 According to Modification 8]

Figure 15:
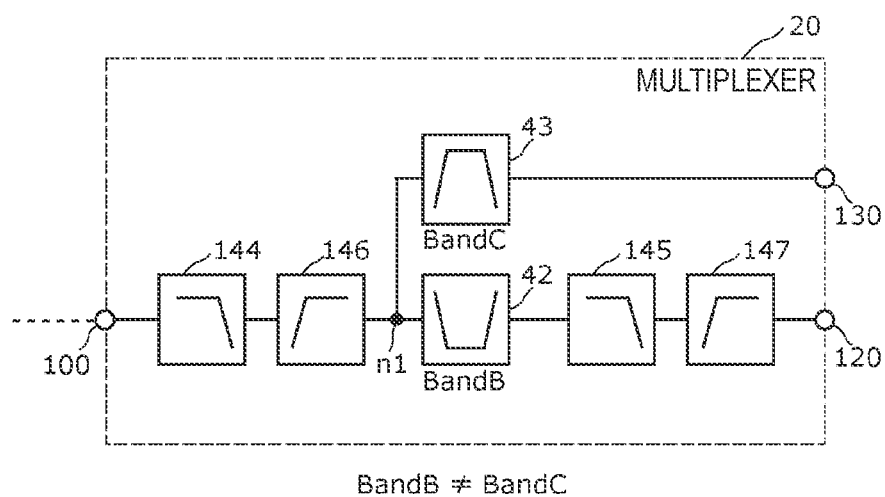
FIG. 15 is a circuit block diagram of a multiplexer according to Modification 8.

FIG. 15 is a circuit block diagram of a multiplexer 20 according to Modification 8. The multiplexer 20 according to Modification 8 includes the common terminal 100, the input/output terminals 120 and 130, the filters 42 and 43, low pass filters 144 and 145, and high pass filters 146 and 147. The multiplexer 20 according to Modification 8 is different compared with the multiplexer 7 according to Embodiment 3 in that low pass filters and high pass filters are both arranged prior to and subsequently to the filter 42 in a divided manner. As for the multiplexer 20 according to Modification 8, description of the same points as those of the multiplexer 7 according to Embodiment 3 is omitted, and different points are mainly described below.

The filter 42 is one example of a second filter, and is a band elimination filter taking the third frequency band as an attenuation band. The filter 43 is one example of a third filter, and is a filter taking the third frequency band as a pass band and the second frequency band as an attenuation band. The filter 42 and the filter 43 each takes the third frequency band as an attenuation band and a pass band, configuring an extractor.

The low pass filter 144 is one example of a sixth filter, and is a low-pass-type filter taking the second frequency band and the third frequency band as pass bands.

The high pass filter 146 is one example of a seventh filter, and is a high-pass-type filter taking the second frequency band and the third frequency band as pass bands.

The low pass filter 145 is one example of an eighth filter, and is a low-pass-type filter taking the second frequency band and the third frequency band as pass bands.

The high pass filter 147 is one example of a ninth filter, and is a high-pass-type filter taking the second frequency band and the third frequency band as pass bands.

Here, the second frequency band and the third frequency band are at least partially different in frequency.

One end of the low pass filter 144 is connected to the common terminal 100, and the other end of the low pass filter 144 is connected to one end of the high pass filter 146. The other end of the high pass filter 146 is connected to one end of the filter 42. The other end of the filter 42 is connected to one end of the low pass filter 145, and the other end of the low pass filter 145 is connected to one end of the high pass filter 147. The other end of the high pass filter 147 is connected to the input/output terminal 120. Also, one end of the filter 43 is connected to a connection node n1 between the other end of the high pass filter 146 and the one end of the filter 42, and the other end of the filter 43 is connected to the input/output terminal 130.

Figure 16:
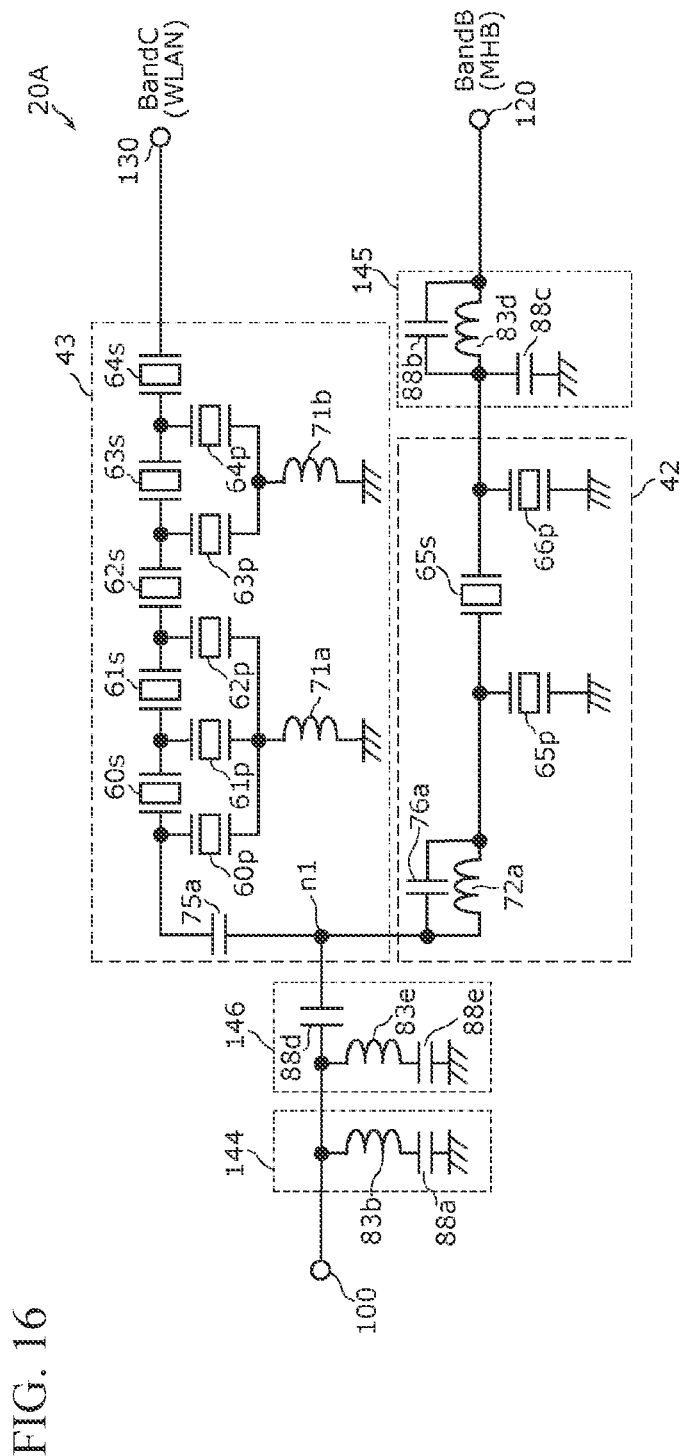
FIG. 16 is a first example of the circuit structure of a multiplexer according to Modification 8.

FIG. 16 is a first example of the circuit structure of the multiplexer 20 according to Modification 8. A multiplexer 20A according to Modification 8 discloses a specific circuit structure example of the multiplexer 20.

The filter 42 has the same structure as that of the filter 42 of the multiplexer 4A according to Example 2, and therefore detailed description is omitted herein.

The filter 43 has the same structure as that of the filter 43 of the multiplexer 4A according to Example 2, and therefore detailed description is omitted herein.

The low pass filter 144 has an inductor 83b and a capacitor 88a. A series connection circuit of the inductor 83b and the capacitor 88a is connected between the ground and a node on a signal path connecting the common terminal 100 and the node n1. That is, the low pass filter 144 has a low pass function mainly by the capacitor 88a arranged on a parallel arm.

The high pass filter 146 has an inductor 83e and capacitors 88d and 88e. The capacitor 88d is arranged in series on a signal path connecting the common terminal 100 and the node n1. A series connection circuit of the inductor 83e and the capacitor 88e is connected between the ground and a node on the signal path connecting the common terminal 100 and the node n1. With the above-described structure, the high pass filter 146 has a high pass function.

The low pass filter 145 has an inductor 83d and capacitors 88b and 88c. A parallel connection circuit of the inductor 83d and the capacitor 88b is arranged in series with a second signal path connecting the filter 42 and the input/output terminal 120. The capacitor 88c is connected between a node on the second signal path and the ground. That is, the low pass filter 145 has a low pass function mainly by the inductor 83d arranged on a series arm and the capacitor 88c arranged on a parallel arm.

Note that the high pass filter 147 is not arranged in the multiplexer 20A.

In the multiplexer 20A according to the present modification, the second frequency band (communication band B) is, for example, a middle-high band, and the third frequency band is, for example, of WLAN.

According to the structure of the multiplexer 20A of the present modification, the low pass filter 144 and the high pass filter 146 are connected between the filters 42 and 43 and the common terminal 100, and the low pass filter 145 is connected to the other end of the filter 42. That is, the low pass filter function of allowing passage through the second frequency band and the third frequency band and attenuating the band on the high-frequency side with respect to the second frequency band and the third frequency band is arranged prior to the filters 42 and 43 (between the common terminal 100 and the filters 42 and 43) and subsequently to the filter 42 (between the filter 42 and the input/output terminal 120) in a divided manner.

The low pass filter 144 has a function of increasing attenuation in a band on a high-frequency side with respect to the second frequency band and the third frequency band of the second signal path and the third signal path. Also, the low pass filter 145 has a function of increasing attenuation in a band on a high-frequency side with respect to the second frequency band and the third frequency band of the second signal path. Furthermore, the low pass filter 145 also has the function of an impedance matching circuit arranged subsequently to the filter 42.

On the other hand, the high pass filter 146 has a function of increasing attenuation on a low-frequency side with respect to the second frequency band and the third frequency band of the second signal path and the third signal path.

That is, on the third signal path connecting the common terminal 100 and the input/output terminal 130, the low pass filter 144 is arranged, but the low pass filter 145 is not arranged. Thus, compared with the multiplexer in which the filter circuit in which the low pass filters 144 and 145 are connected in series is arranged prior to the filters 42 and 43, transmission loss of the third signal path can be reduced by insertion loss of the low pass filter 145. That is, while attenuation in the band on the high-frequency side with respect to the two-frequency band and the third frequency band of the second signal path and the third signal path is sufficiently ensured, transmission loss of the third signal path can be reduced. Furthermore, since the low pass filter 145 is arranged subsequently to the filter 42, circuit elements configuring the low pass filter 145 can be used also as impedance matching elements between the filter 42 and circuit elements connected subsequently to the filter 42. That is, in the multiplexer 20A according to Modification 8, it is not required to separately arrange an impedance matching circuit subsequently to the filter 42. Thus, while transmission loss of the multiplexer 20A is reduced, the number of circuit elements can be reduced, and downsizing can be achieved.

Figure 17:
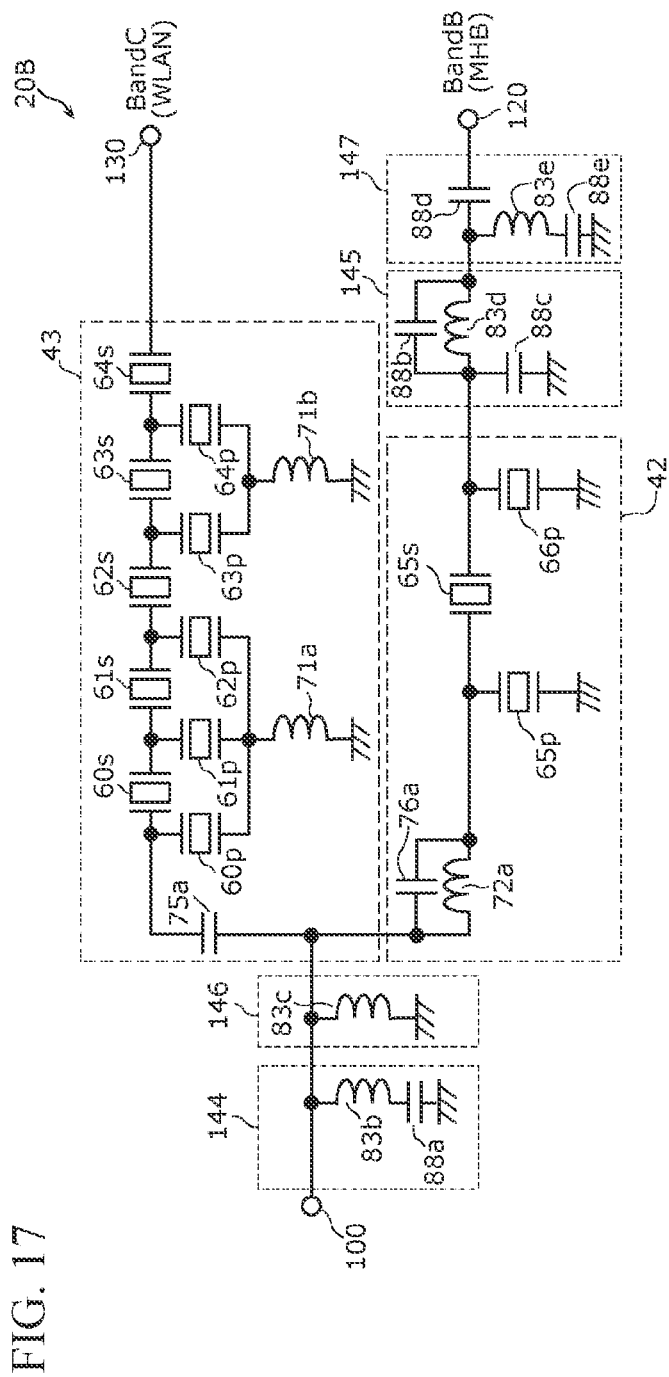
FIG. 17 is a second example of the circuit structure of a multiplexer according to Modification 8.

FIG. 17 is a second example of the circuit structure of the multiplexer 20 according to Modification 8. A multiplexer 20B according to Modification 8 discloses a specific circuit structure example of the multiplexer 20.

The filter 42 has the same structure as that of the filter 42 of the multiplexer 4A according to Example 2, and therefore detailed description is omitted herein.

The filter 43 has the same structure as that of the filter 43 of the multiplexer 4A according to Example 2, and therefore detailed description is omitted herein.

The low pass filter 144 has the same structure as that of the low pass filter 144 of the multiplexer 20A, and therefore detailed description is omitted herein.

The high pass filter 146 has an inductor 83c. The inductor 83c is connected between the ground and a node on a signal path connecting the common terminal 100 and the node n1. With the above-described structure, the high pass filter 146 has a high pass function.

The low pass filter 145 has the same structure as that of the low pass filter 145 of the multiplexer 20A, and therefore detailed description is omitted herein.

The high pass filter 147 has the same structure as that of the high pass filter 47 of the multiplexer 4A according to Example 2, and therefore detailed description is omitted herein.

In the multiplexer 20B according to the present modification, the second frequency band (communication band B) is, for example, a middle-high band, and the third frequency band is, for example, of WLAN.

According to the structure of the multiplexer 20B of the present modification, the low pass filter 144 and the high pass filter 146 are connected between the filters 42 and 43 and the common terminal 100, and the low pass filter 145 and the high pass filter 147 are connected to the other end of the filter 42. That is, the low pass filter function of allowing passage through the second frequency band and the third frequency band and attenuating the band on the high-frequency side with respect to the second frequency band and the third frequency band is arranged prior to the filters 42 and 43 and subsequently to the filter 42 in a divided manner. Also, the high pass filter function of allowing passage through the second frequency band and the third frequency band and attenuating the band on the low-frequency side with respect to the second frequency band and the third frequency band is arranged prior to the filters 42 and 43 and subsequently to the filter 42 in a divided manner. Here, the low pass filter 144 has a function of increasing a reflection coefficient in the band on the high-frequency side with respect to the second frequency band and the third frequency band of the second signal path and the third signal path. Also, the low pass filter 144 has a function of increasing attenuation in the band on the high-frequency side with respect to the second frequency band and the third frequency band of the second signal path and the third signal path. On the other hand, the low pass filter 145 has a function of increasing a reflection coefficient in the band on the high-frequency side with respect to the second frequency band and the third frequency band of the second signal path and the third signal path. Also, the low pass filter 145 has a function of increasing attenuation in the band on the high-frequency side with respect to the second frequency band and the third frequency band of the second signal path. Furthermore, the low pass filter 145 also has the function of an impedance matching circuit arranged subsequently to the filter 42. Note that as for the effect of increasing the reflection coefficient in the band on the high-frequency side with respect to the second frequency band and the third frequency band when the filters 42 and 43 are viewed from the common terminal 100, the effect of the low pass filter 145 is lower than that of the low pass filter 144. This is due to the fact that a low pass filter connected nearer to the common terminal 100 has a higher degree of contribution to the effect of increasing the reflection coefficient in the band on the high-frequency side with respect to the second frequency band and the third frequency band.

On the other hand, the high pass filters 146 and 147 have a function of increasing attenuation on a low-frequency side with respect to the second frequency band and the third frequency band on the second signal path and the third signal path.

That is, on the third signal path connecting the common terminal 100 and the input/output terminal 130, the low pass filter 144 is arranged, but the low pass filter 145 is not arranged. Also, on the third signal path, the high pass filter 146 is arranged, but the high pass filter 147 is not arranged. With this, compared with a multiplexer in which the low pass filters 144 and 145 and the high pass filters 146 and 147 are arranged prior to the filters 42 and 43, transmission loss of the third signal path can be reduced by insertion loss of the low pass filter 145 and the high pass filter 147. That is, while attenuation in the band on the high-frequency side with respect to the second frequency band and the third frequency band of the second signal path and the third signal path and attenuation in the band on the low-frequency side with respect to the second frequency band and the third frequency band are sufficiently ensured, transmission loss of the third signal path can be reduced. Furthermore, since the low pass filter 145 and the high pass filter 147 are arranged subsequently to the filter 42, circuit elements configuring the low pass filter 145 and the high pass filter 147 can be used also as impedance matching elements between the filter 42 and circuit elements connected subsequently to the filter 42. That is, in the multiplexer 20B according to Modification 8, it is not required to separately arrange an impedance matching circuit subsequently to the filter 42. Thus, while transmission loss of the multiplexer 20B is reduced, the number of circuit elements can be reduced, and downsizing can be achieved.

(Effects and so Forth)

As described above, the multiplexer 1 according to the present disclosure includes: a first filter taking a first frequency band as a pass band; a second filter taking a second frequency band as a pass band and a third frequency band as an attenuation band; a third filter taking the third frequency band as a pass band and the first frequency band and the second frequency band as attenuation bands; a fourth filter taking the second frequency band and the third frequency band as pass bands and the first frequency band as an attenuation band; and a fifth filter taking the second frequency band and the third frequency band as pass bands and the first frequency band as an attenuation band. The second frequency band and the third frequency band are at least partially different in frequency. The first frequency band does not overlap the second frequency band and the third frequency band in frequency. One end of the first filter is connected to a common terminal and another end of the first filter is connected to the first input/output terminal. One end of the fourth filter is connected to the common terminal and another end of the fourth filter is connected to one end of the second filter. Another end of the second filter is connected to one end of the fifth filter. Another end of the fifth filter is connected to a second input/output terminal. One end of the third filter is connected to a connection node between the other end of the fourth filter and the one end of the second filter and another end of the third filter is connected to a third input/output terminal.

According to this, the fourth filter and the fifth filter which allow passage through the second frequency band and the third frequency band and attenuate the first frequency band are arranged prior to the second filter and the third filter and subsequently to the second filter in a divided manner. That is, with the arrangement of the fourth filter, isolation between the first filter and the second and third filters can be sufficiently ensured. Also, on the third signal path where the third filter is arranged and which allows a signal in the third frequency band to pass through, the fourth filter is arranged, but the fifth filter is not arranged. Thus, compared with a multiplexer where a filter circuit in which the fourth filter and the fifth filter are connected in series is arranged prior to the second filter and the third filter, transmission loss of the third signal path can be reduced by insertion loss of the fifth filter. That is, while isolation between the first filter and the second and third filters is ensured, transmission loss of the third signal path can be reduced. Furthermore, since the fifth filter is arranged subsequently to the second filter, the fifth filter can be used also as an impedance matching element between the second filter and the circuit component connected subsequently to the second filter. Thus, while transmission loss of the multiplexer is reduced, the number of circuit elements can be reduced, and downsizing can be achieved.

Also, in the multiplexer 1, it may be that the second frequency band and the third frequency band do not overlap in frequency, the first frequency band is positioned on a high-frequency side with respect to the second frequency band and the third frequency band, the filter 11 takes the second frequency band and the third frequency band as attenuation bands, the filter 12 takes the first frequency band and the third frequency band as attenuation bands, the low pass filter 14 takes the second frequency band and the third frequency band as pass bands and the first frequency band as an attenuation band, the low pass filter 15 takes the second frequency band and the third frequency band as pass bands and the first frequency band as an attenuation band.

According to this, since the low pass filter 14 is arranged prior to the filters 12 and 13, isolation between the filter 11 and the filters 12 and 13 can be sufficiently ensured. Also, on the third signal path connecting the common terminal 100 and the input/output terminal 130, the low pass filter 14 is arranged, but the low pass filter 15 is not arranged. Thus, compared with the multiplexer 500 in which the filter circuit (low pass filter 514) in which the low pass filters 14 and 15 are connected in series is arranged prior to the filters 12 and 13, transmission loss of the third signal path can be reduced by insertion loss of the low pass filter 15. That is, while isolation between the filter 11 and the filters 12 and 13 is ensured and attenuation in the first frequency band of the second signal path and the third signal path is sufficiently ensured, transmission loss of the third signal path can be reduced. Furthermore, since the low pass filter 15 is arranged subsequently to the filter 12, circuit elements configuring the low pass filter 15 can be used also as impedance matching elements between the filter 12 and circuit elements connected subsequently to the filter 12. Thus, while transmission loss of the multiplexer 1 is reduced, the number of circuit elements can be reduced, and downsizing can be achieved.

Also, in the multiplexer 2, it may be that the second frequency band and the third frequency band do not overlap in frequency, the first frequency band is positioned on a low-frequency side with respect to the second frequency band and the third frequency band, the filter 11 takes the second frequency band and the third frequency band as attenuation bands, the filter 12 takes the first frequency band and the third frequency band as attenuation bands, the high pass filter 24 takes the second frequency band and the third frequency band as pass bands and the first frequency band as an attenuation band, and the high pass filter 25 takes the second frequency band and the third frequency band as pass bands and the first frequency band as an attenuation band.

According to this, since the high pass filter 24 is arranged prior to the filters 22 and 23, isolation between the filter 21 and the filters 22 and 23 can be sufficiently ensured. Also, on the third signal path connecting the common terminal 100 and the input/output terminal 130, the high pass filter 24 is arranged, but the high pass filter 25 is not arranged. Thus, transmission loss of the third signal path can be reduced by insertion loss of the high pass filter 25. Furthermore, since the high pass filter 25 is arranged subsequently to the filter 22, circuit elements configuring the high pass filter 25 can be used also as impedance matching elements between the filter 22 and circuit elements connected subsequently to the filter 22. Thus, while transmission loss of the multiplexer 2 is reduced, the number of circuit elements can be reduced, and downsizing can be achieved.

Also, in the multiplexer 3, it may be that the second frequency band includes the third frequency band, the first frequency band is positioned on a high-frequency side with respect to the second frequency band and the third frequency band, the filter 31 takes the second frequency band and the third frequency band as attenuation bands, the filter 32 is a band elimination filter taking the third frequency band as an attenuation band, the low pass filter 34 takes the second frequency band and the third frequency band as pass bands and the first frequency band as an attenuation band, and the low pass filter 35 takes the second frequency band and the third frequency band as pass bands and the first frequency band as an attenuation band.

According to this, since the low pass filter 34 is arranged prior to the filters 32 and 33, isolation between the filter 31 and the filters 32 and 33 can be sufficiently ensured. Also, on the third signal path connecting the common terminal 100 and the input/output terminal 130, the low pass filter 35 is not arranged. Thus, transmission loss of the third signal path can be reduced by insertion loss of the low pass filter 35. Furthermore, since the low pass filter 35 is arranged subsequently to the filter 32, circuit elements configuring the low pass filter 35 can be used also as impedance matching elements between the filter 32 and circuit elements connected subsequently to the filter 32. Thus, while transmission loss of the multiplexer 3 is reduced, the number of circuit elements can be reduced, and downsizing can be achieved.

Also, in the multiplexer 3, it may be that the second frequency band includes the third frequency band, the first frequency band is positioned on a low-frequency side with respect to the second frequency band and the third frequency band, the filter 31 takes the second frequency band and the third frequency band as attenuation bands, the filter 32 is a band elimination filter taking the third frequency band as an attenuation band, the low pass filter 34 is a fourth filter having a high pass filter function, and the low pass filter 35 is a fifth filter having a high pass filter function.

According to this, since the fourth filter is arranged prior to the filters 32 and 33, isolation between the filter 31 and the filters 32 and 33 can be sufficiently ensured. Also, on the third signal path connecting the common terminal 100 and the input/output terminal 130, the fifth filter is not arranged. Thus, transmission loss of the third signal path can be reduced by insertion loss of the fifth circuit. Furthermore, since the fifth filter is arranged subsequently to the filter 32, circuit elements configuring the fifth filter can be used also as impedance matching elements between the filter 32 and circuit elements connected subsequently to the filter 32. Thus, while transmission loss of the multiplexer 3 is reduced, the number of circuit elements can be reduced, and downsizing can be achieved.

Also, in the multiplexer 4, it may be that the second frequency band includes the third frequency band, the first frequency band is positioned on a high-frequency side with respect to the second frequency band and the third frequency band, the filter 41 takes the second frequency band and the third frequency band as attenuation bands, the filter 42 is a band elimination filter taking the third frequency band as an attenuation band, the low pass filter 44 takes the second frequency band and the third frequency band as pass bands and the first frequency band as an attenuation band, the high pass filter 46 takes the second frequency band and the third frequency band as pass bands, the low pass filter 45 takes the second frequency band and the third frequency band as pass bands and the first frequency band as an attenuation band, and the high pass filter 47 takes the second frequency band and the third frequency band as pass bands.

According to this, since the low pass filter 44 is arranged prior to the filters 42 and 43, isolation between the filter 41 and the filters 42 and 43 can be sufficiently ensured. Also, on the third signal path connecting the common terminal 100 and the input/output terminal 130, the low pass filter 45 is not arranged. Thus, transmission loss of the third signal path can be reduced by insertion loss of the low pass filter 45. Furthermore, since the low pass filter 45 and the high pass filter 47 are arranged subsequently to the filter 42, circuit elements configuring the low pass filter 45 and the high pass filter 47 can be used also as impedance matching elements between the filter 42 and circuit elements connected subsequently to the filter 42. Thus, while transmission loss of the multiplexer 4 is reduced, the number of circuit elements can be reduced, and downsizing can be achieved.

Also, in the multiplexer 5, it may be that the second frequency band includes the third frequency band, the first frequency band is positioned on a low-frequency side with respect to the second frequency band and the third frequency band, the filter 51 takes the second frequency band and the third frequency band as attenuation bands, the filter 52 is a band elimination filter taking the third frequency band as an attenuation band, the high pass filter 56 takes the second frequency band and the third frequency band as pass bands and the first frequency band as an attenuation band, the low pass filter 54 takes the second frequency band and the third frequency band as pass bands, the high pass filter 57 takes the second frequency band and the third frequency band as pass bands and the first frequency band as an attenuation band, and the low pass filter 55 takes the second frequency band and the third frequency band as pass bands.

According to this, since the high pass filter 56 is arranged prior to the filters 52 and 53, isolation between the filter 51 and the filters 52 and 53 can be sufficiently ensured. Also, on the third signal path connecting the common terminal 100 and the input/output terminal 130, the high pass filter 57 is not arranged. Thus, transmission loss of the third signal path can be reduced by insertion loss of the high pass filter 57. Furthermore, since the low pass filter 55 and the high pass filter 57 are arranged subsequently to the filter 52, circuit elements configuring the low pass filter 55 and the high pass filter 57 can be used also as impedance matching elements between the filter 52 and circuit elements connected subsequently to the filter 52. Thus, while transmission loss of the multiplexer 5 is reduced, the number of circuit elements can be reduced, and downsizing can be achieved.

Also, it may be that the multiplexer 6 further includes, in comparison with the multiplexer 4, the input/output terminal 140 and the filter 61 taking a fourth frequency band as a pass band, the fourth frequency band does not overlap the second frequency band and the third frequency band in frequency and is positioned on a low-frequency side with respect to the second frequency band and the third frequency band, one end of the filter 61 is connected to the common terminal 100 and the other end of the filter 61 is connected to the input/output terminal 140, the low pass filter 44 takes the second frequency band, the third frequency band, and the fourth frequency band as pass bands and the first frequency band as an attenuation band, the high pass filter 46 takes the first frequency band, the second frequency band, and the third frequency band as pass bands and the fourth frequency band as an attenuation band, the low pass filter 45 takes the second frequency band, the third frequency band, and the fourth frequency band as pass bands and the first frequency band as an attenuation band, and the high pass filter 47 takes the first frequency band, the second frequency band, and the third frequency band as pass bands.

According to this, since the low pass filter 44 is arranged prior to the filters 42 and 43, isolation between the filter 41 and the filters 42 and 43 can be sufficiently ensured. Since the high pass filter 46 is arranged prior to the filters 42 and 43, isolation between the filter 61 and the filters 42 and 43 can be sufficiently ensured. Also, on the third signal path connecting the common terminal 100 and the input/output terminal 130, the low pass filter 45 and the high pass filter 47 are not arranged. Thus, transmission loss of the third signal path can be reduced by insertion loss of the low pass filter 45 and the high pass filter 47. Furthermore, since the low pass filter 45 and the high pass filter 47 are arranged subsequently to the filter 42, circuit elements configuring the low pass filter 45 and the high pass filter 47 can be used also as impedance matching elements between the filter 42 and circuit elements connected subsequently to the filter 42. Thus, while transmission loss of the multiplexer 6 is reduced, the number of circuit elements can be reduced, and downsizing can be achieved.

Also, the second frequency band may be a middle-high band (1710 to 2370 MHz and 2496 to 2690 MHz), and the third frequency band may be of WLAN (2400 to 2483 MHz).

Also, the first frequency band may be an ultrahigh band (3300 to 5000 MHz).

Also, the fourth frequency band may be of L5 (1164.4 to 1187.95 MHz) of Global Navigation Satellite System (GNSS).

Also, the first frequency band may be of L5 (1164.4 to 1187.95 MHz) of GNSS.

Also, the communication device 90 includes the antenna 92, the RFIC 91 which processes a high-frequency signal transmitted from and received at the antenna 92, and the above-described multiplexer which transmits the high-frequency signal between the antenna 92 and the RFIC 91.

According to this, the communication device 90 achieving low loss and high isolation can be provided.

Other Embodiments

While the multiplexer and the communication device according to the present disclosure have been described above by citing embodiments, examples, and modifications, the present disclosure is not limited to the above-described embodiments, examples, and modifications. Another embodiment achieved by combining any components in the above-described embodiments, examples, and modifications, a modification obtained by applying various modifications conceived by a person skilled in the art to the above-described embodiments in a range not deviating from the gist of the present disclosure, and various equipment having the multiplexer and the communication device according to the present disclosure incorporated therein are also included in the present disclosure.

For example, in the multiplexers, the frontend circuits, and the communication devices according to the above-described embodiments, examples, and modifications, a matching element, such as an inductor and a capacitor and a switching circuit may be connected between circuit elements. Note that the inductor includes a wire inductor by a wire connecting between circuit elements.

Also, the LC filter is defined as a filter formed of an inductor and a capacitor with one or more pass bands of the LC filter. Thus, the LC filter may include an acoustic wave resonator for forming an attenuation pole that is present outside the pass band.

INDUSTRIAL APPLICABILITY

As a multiplexer and communication device applicable to a multiband system, the present disclosure can be widely used for communication equipment such as cellular phones.

REFERENCE SIGNS LIST 1, 1A, 2, 3, 4, 4A, 5, 5A, 6, 7, 8, 9, 10, 20, 20A, 20B, 500, 500A, 600A, 700 multiplexer
11, 12, 13, 21, 22, 23, 31, 32, 33, 41, 42, 43, 51, 52, 53, 61 filter
14, 14A, 15, 15A, 34, 35, 44, 45, 54, 55, 114, 115, 134, 135, 144, 145, 514, 514A, 602, 714 low pass filter
24, 25, 46, 47, 56, 57, 124, 125, 136, 137, 146, 147, 601 high pass filter
60s, 61s, 62s, 63s, 64s, 65s, 66s, 67s, 68s series-arm resonator 60p, 61p, 62p, 63p, 64p, 65p, 66p, 67p, 68p parallel-arm resonator
71a, 71b, 72a, 73a, 74a, 81a, 81b, 81c, 82a, 82b, 82c, 83a, 83b, 83c, 83d, 83e, 84a, 84b, 84c, 84d, 84e, 520A inductor
75a, 76a, 77a, 77b, 77c, 78a, 85a, 85b, 85c, 87a, 87b, 87c, 88a, 88b, 88c, 88d, 88e, 89a, 89b, 89c, 89d, 89e, 89f, 89g, 89h, 89j capacitor
90 communication device
91 RF signal processing circuit (RFIC)
92 antenna
100 common terminal
110, 120, 130, 140 input/output terminal
520, 720 impedance matching circuit

The invention claimed is:

1. A multiplexer comprising:
a common terminal;
a first input/output terminal;
a second input/output terminal;
a third input/output terminal;
a first filter having a pass band comprising a first frequency band;
a second filter having a pass band comprising a second frequency band, and having an attenuation band comprising a third frequency band;
a third filter having a pass band comprising the third frequency band, and an attenuation band comprising the first frequency band and the second frequency band;
a fourth filter having a pass band comprising the second frequency band and the third frequency band, and having an attenuation band comprising the first frequency band; and
a fifth filter having a pass band comprising the second frequency band and the third frequency band, and having an attenuation band comprising the first frequency band, wherein:
the second frequency band and the third frequency band are at least partially different,
the first frequency band does not overlap the second frequency band and does not overlap the third frequency band,
a first end of the first filter is connected to the common terminal, and a second end of the first filter is connected to the first input/output terminal,
a first end of the fourth filter is connected to the common terminal, and a second end of the fourth filter is connected to a first end of the second filter,
a second end of the second filter is connected to a first end of the fifth filter,
a second end of the fifth filter is connected to the second input/output terminal, and
a first end of the third filter is connected to a node between the second end of the fourth filter and the first end of the second filter, and a second end of the third filter is connected to the third input/output terminal.

2. The multiplexer according to claim 1, wherein:
the second frequency band and the third frequency band do not overlap,
the first frequency band comprises higher frequencies than the second frequency band and the third frequency band,
the first filter has an attenuation band comprising the second frequency band and the third frequency band,
the attenuation band of the second filter comprises the first frequency band and the third frequency band,
the fourth filter is a low pass filter, the pass band of the fourth filter comprising the second frequency band and the third frequency band, and the attenuation band of the fourth filter comprising the first frequency band, and
the fifth filter is a low pass filter, the pass band of the fifth filter comprising the second frequency band and the third frequency band, and the attenuation band of the fifth filter comprising the first frequency band.

3. The multiplexer according to claim 1, wherein:
the second frequency band and the third frequency band do not overlap,
the first frequency band comprises lower frequencies than the second frequency band and the third frequency band,
the first filter has an attenuation band comprising the second frequency band and the third frequency band,
the attenuation band of the second filter comprises the first frequency band and the third frequency band,
the fourth filter is a high pass filter, the pass band of the fourth filter comprising the second frequency band and the third frequency band, and the attenuation band of the fourth filter comprising the first frequency band, and
the fifth filter is a high pass filter, the pass band of the fifth filter comprising the second frequency band and the third frequency band, and the attenuation band of the fifth filter comprising the first frequency band.

4. The multiplexer according to claim 1, wherein:
the second frequency band comprises the third frequency band,
the first frequency band comprises higher frequencies than the second frequency band and the third frequency band,
the first filter has an attenuation band comprising the second frequency band and the third frequency band,
the second filter is a band elimination filter, the attenuation band of the second filter comprising the third frequency band,
the fourth filter is a low pass filter, the pass band of the fourth filter comprising the second frequency band and the third frequency band, and the attenuation band of the fourth filter comprising the first frequency band, and
the fifth filter is a low pass filter, the pass band of the fifth filter comprising the second frequency band and the third frequency band, and the attenuation band of the fifth filter comprising the first frequency band.

5. The multiplexer according to claim 1, wherein:
the second frequency band comprises the third frequency band,
the first frequency band comprises lower frequencies than the second frequency band and the third frequency band,
the first filter has an attenuation band comprising the second frequency band and the third frequency band,
the second filter is a band elimination filter, the attenuation band of the second filter comprising the third frequency band,
the fourth filter is a high pass filter, the pass band of the fourth filter comprising the second frequency band and the third frequency band, and the attenuation band of the fourth filter comprising the first frequency band, and
the fifth filter is a high pass filter, the pass band of the fifth filter comprising the second frequency band and the third frequency band, and the attenuation band of the fifth filter comprising the first frequency band.

6. The multiplexer according to claim 1, wherein:
the second frequency band comprises the third frequency band,
the first frequency band comprises higher frequencies than the second frequency band and the third frequency band,
the first filter has an attenuation band comprising the second frequency band and the third frequency band,
the second filter is a band elimination filter, the attenuation band of the second filter comprising the third frequency band,
the fourth filter comprises a sixth filter and a seventh filter connected in series between the common terminal and the second filter,
the fifth filter comprises an eighth filter and a ninth filter connected in series between the second filter and the second input/output terminal,
the sixth filter is a low pass filter having a pass band comprising the second frequency band and the third frequency band, and having an attenuation band comprising the first frequency band,
the seventh filter is a high pass filter having a pass band comprising the second frequency band and the third frequency band,
the eighth filter is a low pass filter having a pass band comprising the second frequency band and the third frequency band, and having an attenuation band comprising the first frequency band, and
the ninth filter is a high pass filter having a pass band comprising the second frequency band and the third frequency band.

7. The multiplexer according to claim 1, wherein:
the second frequency band comprises the third frequency band,
the first frequency band comprises lower frequencies than the second frequency band and the third frequency band,
the first filter has an attenuation band comprising the second frequency band and the third frequency band,
the second filter is a band elimination filter, the attenuation band of the second filter comprising the third frequency band,
the fourth filter comprises a sixth filter and a seventh filter connected in series between the common terminal and the second filter,
the fifth filter comprises an eighth filter and a ninth filter connected in series between the second filter and the second input/output terminal,
the sixth filter is a low pass filter having a pass band comprising the second frequency band and the third frequency band,
the seventh filter is a high pass filter having a pass band comprising the second frequency band and the third frequency band, and having an attenuation band comprising the first frequency band,
the eighth filter is a low pass filter having a pass band comprising the second frequency band and the third frequency band, and
the ninth filter is a high pass filter having a pass band comprising the second frequency band and the third frequency band, and having an attenuation band comprising the first frequency band.

8. The multiplexer according to claim 6, further comprising:
a fourth input/output terminal; and
a tenth filter having a pass band comprising a fourth frequency band, wherein:
the fourth frequency band does not overlap the second frequency band or the third frequency band, and comprises lower frequencies than the second frequency band and the third frequency band,
a first end of the tenth filter is connected to the common terminal, and a second end of the tenth filter is connected to the fourth input/output terminal,
the sixth filter is a low pass filter, the pass band of the sixth filter comprising the second frequency band, the third frequency band, and the fourth frequency band, and the attenuation band of the sixth filter comprising the first frequency band,
the seventh filter is a high pass filter, the pass band of the seventh filter comprising the first frequency band, the second frequency band, and the third frequency band, and the attenuation band of the seventh filter comprising the fourth frequency band,
the eighth filter is a low pass filter, the pass band of the eighth filter comprising the second frequency band, the third frequency band, and the fourth frequency band, and the attenuation band of the eighth filter comprising the first frequency band, and
the ninth filter is a high pass filter, the pass band of the ninth filter comprising the first frequency band, the second frequency band, and the third frequency band, and the attenuation band of the ninth filter comprising the fourth frequency band.

9. The multiplexer according to claim 1, wherein:
the second frequency band is a middle-high band (1710 to 2370 MHz and 2496 to 2690 MHz), and
the third frequency band is of WLAN (2400 to 2483 MHz).

10. The multiplexer according to claim 1, wherein the first frequency band is an ultrahigh band (3300 to 5000 MHz).

11. The multiplexer according to claim 8, wherein the fourth frequency band is of L5 (1164.4 to 1187.95 MHz) of Global Navigation Satellite System (GNSS).

12. The multiplexer according to claim 1, wherein the first frequency band is of L5 (1164.4 to 1187.95 MHz) of Global Navigation Satellite System (GNSS).

13. A communication device comprising:
an antenna;
a radio frequency (RF) signal processing circuit configured to process a high-frequency signal transmitted from and received at the antenna; and
the multiplexer according to claim 1, the multiplexer being configured to transmit the high-frequency signal between the antenna and the RF signal processing circuit.

* * * * *